(12) United States Patent
Kho et al.

(10) Patent No.: US 12,422,931 B2
(45) Date of Patent: *Sep. 23, 2025

(54) DISPLAY APPARATUS

(71) Applicant: LG Display Co., Ltd., Seoul (KR)

(72) Inventors: YuSeon Kho, Paju-si (KR); Yong-Su Ham, Paju-si (KR); YongWoo Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/633,501

(22) Filed: Apr. 11, 2024

(65) Prior Publication Data

US 2024/0260309 A1    Aug. 1, 2024

Related U.S. Application Data

(63) Continuation of application No. 17/111,980, filed on Dec. 4, 2020, now Pat. No. 12,004,373.

(30) Foreign Application Priority Data

Dec. 16, 2019  (KR) .................. 10-2019-0168074

(51) Int. Cl.
*G06F 3/01* (2006.01)
*H10K 50/842* (2023.01)
(Continued)

(52) U.S. Cl.
CPC ......... *G06F 3/016* (2013.01); *H10K 50/8426* (2023.02); *H10K 59/00* (2023.02);
(Continued)

(58) Field of Classification Search
CPC .. H10K 59/00; H10K 50/8426; H10N 30/204; G06F 3/016
See application file for complete search history.

(56) References Cited

U.S. PATENT DOCUMENTS 8,032,997 B2  10/2011  Numata et al.
9,070,864 B2   6/2015  Hayashi et al.
(Continued)

FOREIGN PATENT DOCUMENTS

CN       1839339 A     9/2006
CN     103444205 A    12/2013
(Continued)

OTHER PUBLICATIONS

Office Action issued Apr. 24, 2024 for Korean Patent Application No. 10-2019-0168074 (Note: US 2016/0034057 A1 was cited in a prior IDS.).
(Continued)

*Primary Examiner* — Peter D McLoone
(74) *Attorney, Agent, or Firm* — Morgan, Lewis & Bockius LLP

(57) ABSTRACT

A display apparatus includes a display panel configured to display an image and a film actuator configured to vibrate the display panel. The film actuator may include a plurality of vibration generating devices configured with a composite film. The plurality of vibration generating devices may be configured to have different expansion coefficients from each other.

45 Claims, 12 Drawing Sheets

(51) Int. Cl.
  *H10K 59/00*   (2023.01)
  *H10N 30/20*   (2023.01)
  *H10K 59/80*   (2023.01)

(52) U.S. Cl.
  CPC ....... *H10N 30/204* (2023.02); *H10K 59/8722* (2023.02); *H10K 59/873* (2023.02)

(56) References Cited

U.S. PATENT DOCUMENTS

| | | | |
|---|---|---|---|
| 10,209,791 B2* | 2/2019 | Ikeda | G06F 3/041 |
| 10,963,052 B2 | 3/2021 | Choi et al. | |
| 2007/0092092 A1 | 4/2007 | Kondo et al. | |
| 2007/0097073 A1 | 5/2007 | Takashima et al. | |
| 2007/0189024 A1 | 8/2007 | Nanbu et al. | |
| 2009/0231959 A1 | 9/2009 | Korbler et al. | |
| 2010/0308694 A1 | 12/2010 | Numata et al. | |
| 2012/0013220 A1 | 1/2012 | Kawata et al. | |
| 2012/0242593 A1 | 9/2012 | Kim et al. | |
| 2013/0114378 A1 | 5/2013 | Rolt | |
| 2013/0120941 A1 | 5/2013 | Peterson et al. | |
| 2013/0259274 A1 | 10/2013 | Hayashi et al. | |
| 2014/0098978 A1 | 4/2014 | Fukuoka et al. | |
| 2015/0312681 A1 | 10/2015 | Ruile et al. | |
| 2016/0034057 A1 | 2/2016 | Ikeda et al. | |
| 2017/0280216 A1 | 9/2017 | Lee et al. | |
| 2018/0120941 A1 | 5/2018 | Choi et al. | |
| 2019/0037164 A1 | 1/2019 | Kim et al. | |
| 2019/0050024 A1 | 2/2019 | Ahn et al. | |
| 2019/0182572 A1 | 6/2019 | Kim | |
| 2019/0208299 A1 | 7/2019 | Kim et al. | |
| 2021/0183966 A1 | 6/2021 | Kho et al. | |

FOREIGN PATENT DOCUMENTS

| | | |
|---|---|---|
| CN | 105096778 A | 11/2015 |
| CN | 108021276 A | 5/2018 |
| CN | 108124218 A | 6/2018 |
| CN | 108227913 A | 6/2018 |
| CN | 109389917 A | 2/2019 |
| CN | 109391889 A | 2/2019 |
| CN | 109905801 A | 6/2019 |
| CN | 115297408 A | 11/2022 |
| CN | 115297409 A | 11/2022 |
| KR | 10-2007-0043671 A | 4/2007 |
| KR | 10-2010-0098525 A | 9/2010 |
| KR | 10-1919454 B1 | 11/2018 |
| KR | 10-2019-0065761 A | 6/2019 |
| KR | 10-2019-0081969 A | 7/2019 |

OTHER PUBLICATIONS

Office Action dated Jan. 26, 2022, issued in corresponding CN Patent Application No. 202011393134.6 (translation submitted in parent application).

Office Action dated 202210944988.1 issued in corresponding Chinese Patent Application No. Feb. 27, 2025. (Note: CN 109391889 A and US 2007/0189024 A1 were previously cited.).

Office Action dated 202210945837.8 issued in corresponding Chinese Patent Application No. Mar. 22, 2025. (Note: US 2012/0242593 A1, US 2016/0034057 A1 and CN 109391889 A were previously cited.).

* cited by examiner

DISPLAY APPARATUS

CROSS-REFERENCE TO RELATED APPLICATIONS

This application is a continuation of co-pending U.S. patent application Ser. No. 17/111,980, filed on Dec. 4, 2020, which claims the benefit of and priority to the Korean Patent Application No. 10-2019-0168074, filed on Dec. 16, 2019. The entirety of each of the above prior U.S. and Korean patent applications is hereby incorporated by reference as if fully set forth herein.

BACKGROUND

Technical Field

The present disclosure relates to a display apparatus.

Discussion of the Related Art

In display apparatuses, a display panel displays an image, and a separate speaker should be installed for providing a sound generally. When a speaker is disposed in a display apparatus, the speaker occupies a space, and due to this, the design and spatial disposition of the display apparatus are limited.

A speaker applied to display apparatuses may be, for example, an actuator including a magnet and a coil. However, when the actuator is applied to the display apparatuses, a thickness thereof is thick. Piezoelectric elements which enable thinness to be implemented are attracting much attention.

Because the piezoelectric elements have a fragile characteristic, the piezoelectric elements are easily damaged by an external impact, and due to this, the reliability of sound reproduction is low. Also, when a piezoelectric element is configured as one layer for realizing different frequencies without any increase in thickness of the piezoelectric element, there may be a problem where it is difficult to output a desired sound.

SUMMARY

Accordingly, embodiments of the present disclosure are directed to a display apparatus that substantially obviates one or more problems due to limitations and disadvantages of the related art.

Therefore, the inventors have recognized problems described above and have performed various experiments for enhancing the quality of a sound and outputting a desired sound despite being implemented as one layer. Through the various experiments, the inventors have invented a display apparatus having a new structure for enhancing the quality of a sound and outputting a desired sound on the basis of being implemented as one layer.

An aspect of the present disclosure is to provide a display apparatus including a vibration generating device which is disposed on a rear surface of a display panel and vibrates the display panel to generate a sound, and thus, a sound pressure characteristic and the localization of a sound are excellent.

Another aspect of the present disclosure is to provide a display apparatus including a vibration generating device for decreasing the occurrence of heat.

Additional features and aspects of the disclosure will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and claims hereof as well as the appended drawings.

To achieve these and other inventive concepts, as embodied and broadly described herein, a display apparatus comprises a display panel configured to display an image and a plurality of vibration generating devices configured to vibrate the display panel, wherein each of the plurality of vibration generating devices includes a plurality of first portions having a piezoelectric characteristic and a plurality of second portions disposed near the plurality of first portions to have an expansion coefficient, and the plurality of vibration generating devices have different expansion coefficients.

In another aspect, a display apparatus comprises a display panel configured to display an image and a plurality of vibration generating devices configured to vibrate the display panel, wherein each of the plurality of vibration generating devices includes a plurality of piezoelectric portions having a piezoelectric characteristic and a plurality of expansion portions disposed near the plurality of piezoelectric portions, and the plurality of vibration generating devices are implemented to have different frequency characteristics.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION

Figure 1:
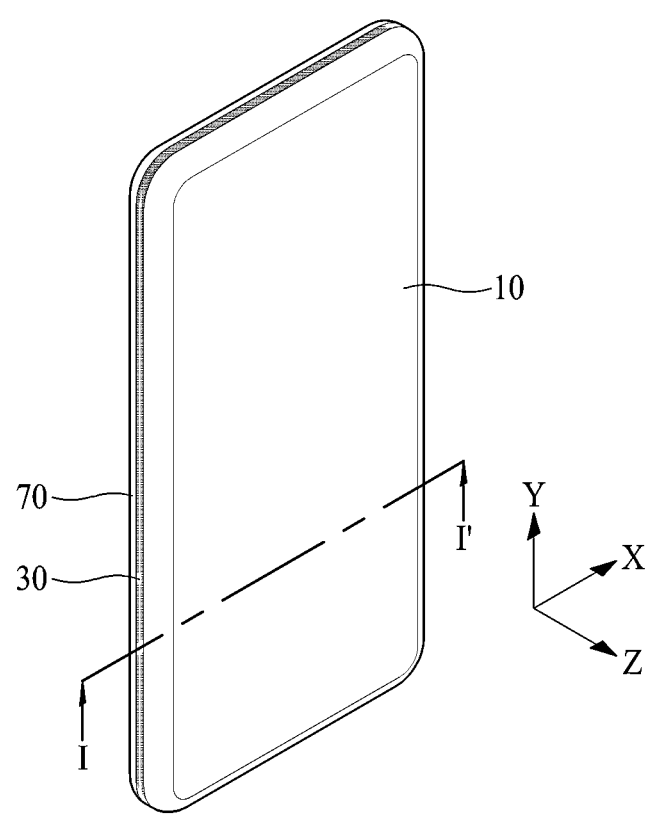
FIG. 1 illustrates a display apparatus according to an embodiment of the present disclosure.

Reference will now be made in detail to exemplary embodiments of the present disclosure, examples of which may be illustrated in the accompanying drawings.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

Throughout the drawings and the detailed description, unless otherwise described, the same drawing reference numerals should be understood to refer to the same elements, features, and structures. The relative size and depiction of these elements may be exaggerated for clarity, illustration, and convenience. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

A shape, a size, a ratio, an angle, and a number disclosed in the drawings for describing embodiments of the present disclosure are merely an example, and thus, an embodiment of the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where "comprise," "have," and "include" described in the present specification are used, another part may be added unless "only" is used. The terms of a singular form may include plural forms unless referred to the contrary.

In construing an element, the element is construed as including an error or tolerance range although there is no explicit description of such an error or tolerance range.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not limited by these terms. The expression that an element is "connected," "coupled," or "adhered" to another element or layer indicates the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the present disclosure, examples of a display apparatus may include a narrow-sense display apparatus such as an organic light emitting display (OLED) module or a liquid crystal module (LCM) including a display panel and a driver for driving the display panel. Also, examples of the display apparatus may include a set device (or a set apparatus) or a set electronic device such as a notebook computer, a TV, a computer monitor, an equipment apparatus including an automotive apparatus or another type apparatus for vehicles, or a mobile electronic device such as a smartphone or an electronic pad, which is a complete product (or a final product) including an LCM or an OLED module.

Therefore, in the present disclosure, examples of the display apparatus may include a narrow-sense display apparatus itself, such as an LCM or an OLED module, and a set device which is a final consumer device or an application product including the LCM or the OLED module.

In some embodiments, an LCM or an OLED module including a display panel and a driver may be referred to as a narrow-sense display apparatus, and an electronic apparatus which is a final product including an LCM or an OLED module may be referred to as a set apparatus. For example, the narrow-sense display apparatus may include a display panel, such as an LCD or an OLED, and a source printed circuit board (PCB) which is a controller for driving the display panel. The set device may further include a set PCB which is a set controller electrically connected to the source PCB to overall control the set apparatus.

A display panel applied to an embodiment of the present disclosure may use all types of display panels such as a liquid crystal display panel, an organic light emitting diode (OLED) display panel, and an electroluminescent display panel, but embodiments are not limited to a specific display panel which is vibrated by a sound generation device according to an embodiment of the present disclosure to output a sound. Also, a shape or a size of a display panel applied to a display apparatus according to an embodiment of the present disclosure is not limited.

For example, if the display panel is the liquid crystal display panel, the display panel may include a plurality of gate lines, a plurality of data lines, and a plurality of pixels respectively provided in a plurality of pixel areas defined by intersections of the gate lines and the data lines. Also, the display panel may include an array substrate including a thin film transistor (TFT) which is a switching element for adjusting a light transmittance of each of the plurality of pixels, an upper substrate including a color filter and/or a black matrix, and a liquid crystal layer between the array substrate and the upper substrate.

Moreover, if the display panel is the organic light emitting display panel, the display panel may include a plurality of gate lines, a plurality of data lines, and a plurality of pixels respectively provided in a plurality of pixel areas defined by intersections of the gate lines and the data lines. Also, the display panel may include an array substrate including a TFT which is an element for selectively applying a voltage to each of the pixels, an organic light emitting device layer on the array substrate, and an encapsulation substrate disposed on the array substrate to cover the organic light emitting device layer. The encapsulation substrate may protect the TFT and the organic light emitting device layer from an external impact and may prevent water or oxygen from penetrating into the organic light emitting device layer. Also, a layer provided on the array substrate may include an inorganic light emitting layer (for example, a nano-sized material layer, a quantum dot, or the like). As another example, the layer provided on the array substrate may include a micro light emitting diode.

The display panel may further include a backing such as a metal plate attached on the display panel. However, embodiments are not limited to the metal plate, and the display panel may include another structure.

In an embodiment of the present disclosure, the display panel may be applied to vehicles as a user interface module such as a central control panel for automobiles. For example, the display panel may be provided between occupants sitting on two front seats in order for a vibration of the display panel to be transferred to the inside of a vehicle. Therefore, an audio experience in a vehicle is improved in comparison with a case where speakers are disposed on interior sides of the vehicle.

Hereinafter, embodiments of the present disclosure will be described in detail with reference to the accompanying drawings. In adding reference numerals to elements of each of the drawings, although the same elements are illustrated in other drawings, like reference numerals may refer to like elements. Also, for convenience of description, a scale of each of elements illustrated in the accompanying drawings differs from a real scale, and thus, is not limited to a scale illustrated in the drawings.

In order for a display apparatus to provide a sound, a speaker may be implemented as a film type, thereby thinning a thickness of the display apparatus. A film type vibration generating device may be manufactured to have a large area and may be applied to a display apparatus having a large area, but since the film type vibration module is low in piezoelectric characteristic, it is difficult to apply the film type vibration generating device to a large area due to a low vibration. A vibration generating device may be formed of a piezoelectric composite where a polymer is provided between ceramics, so that the vibration generating device has flexibility. When a piezoelectric composite is formed by adding a polymer, the imbalance of a phase difference may occur due to a stiffness difference between ceramic and a polymer. The imbalance of a phase difference may reduce the bending-deformation characteristic of a flexible display apparatus, and due to this, it may be difficult to apply a vibration generating device to the flexible display apparatus. Also, when each of a plurality of vibration generating devices having different frequencies is disposed in a display apparatus, a thickness of the display apparatus may increase. Therefore, the inventors have performed various experiments for implementing a vibration generating device where a stiffness difference with ceramic is small, a bending characteristic is enhanced, and a thickness of a display apparatus does not increase. Through the various experiments, the inventors have invented a vibration generating device which may be applied to a flexible display apparatus, may not increase in thickness of a display apparatus, may have different frequency characteristics, and may be implemented as a film type formed of one layer. This will be described below in detail.

Figure 2:
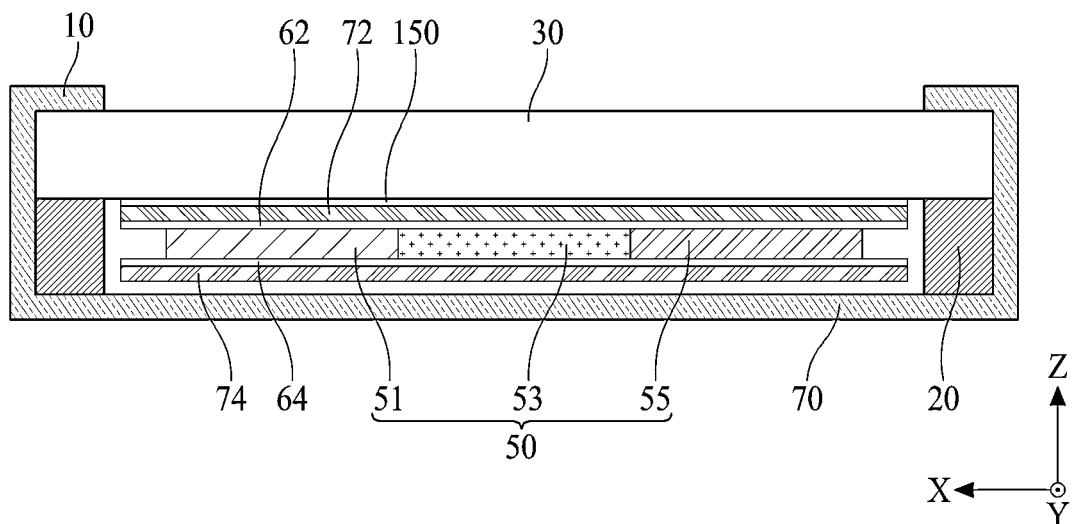
FIG. 2 is a cross-sectional view taken along line I-I' illustrated in FIG. 1.

FIG. 1 illustrates a display apparatus according to an embodiment of the present disclosure. FIG. 2 is a cross-sectional view taken along line I-I' illustrated in FIG. 1.

With reference to FIGS. 1 and 2, the display apparatus 100 according to an embodiment of the present disclosure may include a front member 10, a display panel 30, and a supporting member 70.

The front member 10 may cover a front surface and a side surface of the display panel 30. Accordingly, the front member 10 may protect the display panel 30 from an external impact.

The front member 10 according to an embodiment of the present disclosure may include a transparent plastic material, a glass material, or a tempered glass material, but embodiments are not limited thereto. For example, the front member 10 may include one of sapphire glass and gorilla glass or a stacked structure thereof. As another example, the front member 10 may include a transparent plastic material such as polyethyleneterephthalate (PET). The front member 10 may include tempered glass based on a scratch and transparency, and in this case, the front member 10 may be referred to as a cover glass.

The display panel 30 may be coupled or connected to a rear surface (or a backside surface) of the front member 10 and may display an image or may sense a user touch. The display panel 30 may display an image (for example, an electronic image or a digital image) and may be implemented as a curved display panel or one of all types of display panels such as a liquid crystal display panel, an organic light emitting diode (OLED) display panel, an electroluminescent display panel, etc. If the display panel 30 vibrates based on a vibration of a vibration generating device 50 to generate a sound (or a sound wave) or to generate a haptic feedback responding to a touch, the display panel 100 is not limited to a specific display panel.

For example, the display panel 30 may display an image in a type such as a top emission type, a bottom emission type, or a dual emission type, based on a structure of a pixel array layer including an anode electrode, a cathode electrode, and an organic compound layer. In the top emission type, visible light emitted from the pixel array layer may be irradiated onto a region in front of a base substrate to allow an image to be displayed, and in the bottom emission type, the visible light emitted from the pixel array layer may be irradiated onto a rearward region behind the base substrate to allow an image to be displayed.

The vibration generating device 50 may be disposed on a rear surface of the display panel 30. For example, by using the display panel 30 as a vibration plate, the vibration generating device 50 may generate a sound or may output a haptic feedback responding to a user touch. For example, the vibration generating device 50 may be a sound device or a haptic device, which outputs a sound or a vibration based on an electrical signal.

The display panel 30 according to an embodiment of the present disclosure may include a thin film transistor (TFT) array substrate, which includes a plurality of pixels defined by intersections of a plurality of gate lines and/or a plurality of data lines, and a TFT which is provided at each of the plurality of pixels to drive a corresponding pixel. The display panel 30 may include a light emitting device layer provided on the TFT array substrate and an encapsulation substrate covering the light emitting device layer. For example, the encapsulation substrate may protect the TFT and the light emitting device layer from an external impact and may prevent water or moisture from penetrating into the light emitting device layer.

The display panel 30 according to an embodiment of the present disclosure may include a bending portion which is bent or curved to have a curved shape or a certain curvature radius.

The bending portion of the display panel 30 may be provided at at least one of one edge or periphery and the other edge or periphery of the display panel 30 which are parallel to each other. The one edge or periphery and/or the other edge or periphery, where the bending portion is provided, of the display panel 30 may include only the non-display area, or may include an edge or periphery of the display area and the non-display area. Here, the display panel 30 including the bending portion provided by bending of the non-display area may have a structure where a one-side bezel bending structure or a both-side bezel bending structure. Also, the display panel 30 including the bending portion provided by bending of the non-display area and the edge or periphery of the display area may have a one-side active bending structure or a both-side active bending structure.

The display apparatus 100 according to an embodiment of the present disclosure may further include a supporting member 70, configured to support the display panel 30, and a connection member 20 disposed between the display panel 30 and the supporting member 70.

The supporting member 70 may be referred to as the other term such as a cover bottom, a plate bottom, a back cover, a base frame, a metal frame, a metal chassis, a chassis base, or an m-chassis. Therefore, the supporting member 70 may be a supporter which supports the display panel 30 and may be implemented as an arbitrary type frame or a plate structure each disposed on a rear surface of the display apparatus 100.

The supporting member 70 according to an embodiment of the present disclosure may cover the whole rear surface of the display panel 30. For example, the supporting member 70 may include at least one of a glass material, a metal material, and a plastic material each having a plate shape. Here, an edge or a sharp corner of the supporting member 70 may have an inclined shape or a curved shape through a chamfer process or a corner rounding process. For example, the glass material of the supporting member 70 may be sapphire glass. As another example, the supporting member 70 including the metal material may include one of aluminum (Al), an Al alloy, a magnesium (Mg) alloy, and an iron (Fe)-nickel (Ni) alloy.

The supporting member 70 according to an embodiment of the present disclosure may additionally cover a side surface of the display panel 30. For example, the supporting member 70 may include a rear surface portion which covers the rear surface of the display panel 30 and a side surface portion which is connected to an end or portion of the rear surface portion and covers the side surface of the display panel 30. For example, the rear surface portion may cover a portion or the entire rear surface of the display panel 30. For example, the side surface portion may cover a portion or of the entire side surface of the display panel 30. However, embodiments are not limited thereto, and the supporting member 70 may be implemented so that the rear surface portion and the side surface portion are provided as one body.

The supporting member 70 according to an embodiment of the present disclosure may be connected to a rear periphery of the display panel 30 by the connection member 20. The connection member 20 may be disposed between the rear periphery of the display panel 30 and a periphery of the supporting member 70 and may attach the display panel 30 on the supporting member 70. The connection member 20 according to an embodiment of the present disclosure may be implemented with a double-sided tape, a single-sided tape, a double-sided adhesive foam pad, or a single-sided adhesive foam pad, but embodiments are not limited thereto.

The vibration generating device 50 may be disposed on the rear surface (or a backside surface) of the display panel 30. The vibration generating device 50 may be attached on the rear surface of the display panel 30 by an adhesive member 150.

The adhesive member 150 according to an embodiment of the present disclosure may be disposed between the rear surface of the display panel 30 and the vibration generating device 50. For example, the adhesive member 150 may attach the vibration generating device 50 on the rear surface of the display panel 30 and may be an adhesive or a double-sided adhesive tape including an adhesive layer which is good in an adhesive force or an attaching force. For example, the adhesive layer of the adhesive member 150 may include epoxy, acryl, silicon, urethane, or paraffin wax, but embodiments are not limited thereto. The adhesive layer of the adhesive member 150 may further include an additive such as a tackifier, a wax component, or an anti-oxidation agent. The additive may prevent the adhesive member 150 from being detached (stripped) from the display panel 30 by a vibration of the vibration module 200. For example, the tackifier may be rosin derivative or the like and the wax component may be paraffin wax or the like, but embodiments of the present disclosure are not limited thereto. For example, the anti-oxidation agent may be a phenol-based anti-oxidation agent, and for example, may be thioester, but embodiments of the present disclosure are not limited thereto.

According to another embodiment of the present disclosure, the adhesive member 150 may further include a hollow portion provided between the display panel 30 and the vibration generating device 50. The hollow portion of the adhesive member 150 may provide an air gap between the display panel 30 and the vibration generating device 50. Due to the air gap, a sound wave (or a sound pressure) based on a vibration of the vibration generating device 50 may not be dispersed by the adhesive member 150 and may concentrate on the display panel 30, and thus, the loss of a vibration caused by the adhesive member 150 may be minimized, thereby increasing a sound pressure characteristic of a sound generated based on a vibration of the display panel 30.

The vibration generating device 50 may be implemented as a film type. The vibration generating device 50 may have a thickness which is thinner than that of the display panel 30, and thus, a thickness of the display panel 30 may not increase despite the vibration generating device 50. The vibration generating device 50 may be referred to as an actuator, an exciter, a transducer, a sound generating module, a sound generating device, a film actuator, a film type piezoelectric composite actuator, a film speaker, a film type piezoelectric speaker, or a film type piezoelectric composite speaker, but the terms are not limited thereto.

The vibration generating device 50 may include a first vibration generating device 51, a second vibration generating device 53, and a third vibration generating device 55. The first vibration generating device 51, the second vibration generating device 53, and the third vibration generating device 55 may be implemented to have different frequency characteristics. This will be described below with reference to FIGS. 3A to 6C.

A first electrode 62 may be disposed on an upper surface of the vibration generating device 50, and a second electrode 64 may be disposed on a lower surface of the vibration generating device 50.

The first electrode 62 may be disposed on a first surface (or a front surface) of the vibration generating device 50. The first electrode 62 according to an embodiment of the present disclosure may include a transparent conductive material, a semitransparent conductive material, or an opaque conductive material. For example, examples of the transparent conductive material or the semitransparent conductive material may include indium tin oxide (ITO) or indium zinc oxide (IZO), but embodiments are not limited thereto. Examples of the opaque conductive material may include aluminum (Al), copper (Cu), gold (Au), silver (Ag), molybdenum (Mo), and Mg or an alloy thereof, but embodiments are not limited thereto.

The second electrode 64 may be disposed on a second surface (or a rear surface), which is opposite to the first surface, of the vibration generating device 50. The second electrode 64 according to an embodiment of the present disclosure may include a transparent conductive material, a semitransparent conductive material, or an opaque conductive material. For example, the second electrode 64 may include the same material as that of the first electrode 62, but embodiments are not limited thereto.

The vibration generating device 50 according to an embodiment of the present disclosure may further include a first protection layer 72 and a second protection layer 74.

The first protection layer 72 may be disposed on the first electrode 62 and may protect the first electrode 62 or the first surface of the vibration generating device 50. For example, the first protection layer 72 may support the vibration generating device 50 or may protect the vibration generating device 50 from an external impact. For example, the first protection layer 72 may be a polyimide (PI) film or a polyethyleneterephthalate (PET) film, but embodiments are not limited thereto.

The second protection layer 74 may be disposed on the second electrode 64 and may protect the second electrode 64 or the second surface of the vibration generating device 50. For example, the second protection layer 74 may support the vibration generating device 50 or may protect the vibration generating device 50 from an external impact. For example, the second protection layer 74 may be a PI film or a PET film, but embodiments are not limited thereto.

Figure 3A:
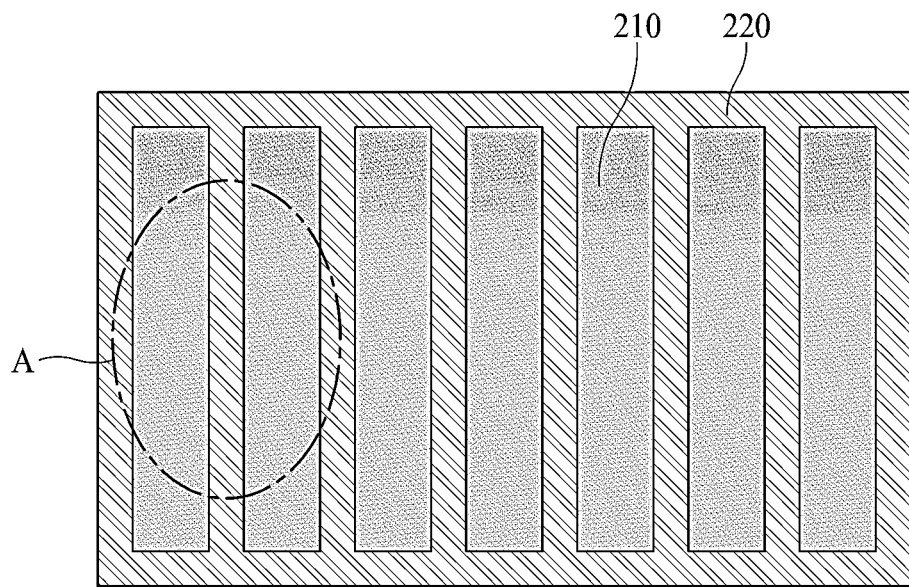
FIGS. 3A and 3B illustrate a vibration generating device according to an embodiment of the present disclosure.
Figure 3B:
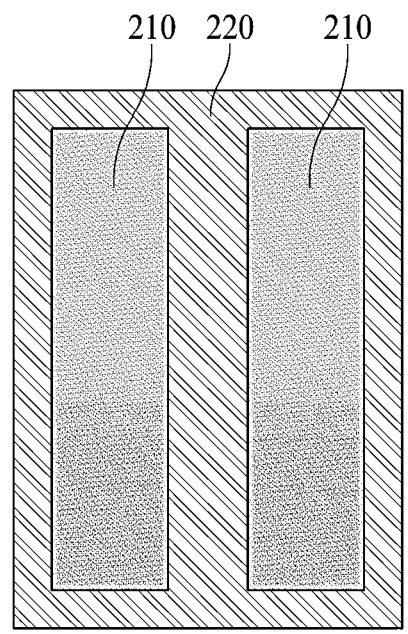

FIGS. 3A and 3B illustrate a vibration generating device according to an embodiment of the present disclosure.

With reference to FIGS. 3A and 3B, the vibration generating device 50 according to an embodiment of the present disclosure may include a plurality of first portions 210 and a plurality of second portions 220. For example, the plurality of first portions 210 may have a piezoelectric characteristic, and the plurality of second portions 220 may be disposed near the first portion 210. For example, the plurality of second portions 220 may have flexibility. Each of the plurality of first portions 210 may be referred to as a piezoelectric portion, a piezoelectric material portion, or a vibration portion, but the terms are not limited thereto.

The plurality of first portions 210 according to an embodiment of the present disclosure may include piezoelectric ceramic. For example, the piezoelectric ceramic may be a lead zirconate titanate (PZT)-based material, but embodiments are not limited thereto. For example, the plurality of first portions 210 may include a lead zirconate titanate (PZT)-based material including lead (Pb), zirconium (Zr), and titanium (Ti) or may include a lead zirconate nickel niobate (PZNN)-based material including lead (Pb), zinc (Zn), nickel (Ni), and niobium (Nb), but is not limited thereto. As another example, the plurality of first portions 210 may include at least one of $CaTiO_3$, $BaTiO_3$, and $SrTiO_3$ without Pb, but embodiments are not limited thereto.

Each of the plurality of first portions 210 according to an embodiment of the present disclosure may be formed of a ceramic-based material for generating a relatively high vibration, or may be formed of piezoelectric ceramic having a perovskite-based crystalline structure. The perovskite crystalline structure may have a piezoelectric effect and an inverse piezoelectric effect and may be a plate-shaped structure having orientation. The perovskite crystalline structure may be represented by a chemical formula "$ABO_3$". Here, A may include a divalent metal element, and B may include a tetravalent metal element. For example, in the chemical formula "$ABO_3$", A and B may be cations, and O may be anions. For example, the chemical formula "$ABO_3$" may include one of $PbTiO_3$, $PbZrO_3$, $BaTiO_3$, and $SrTiO_3$, but embodiments are not limited thereto.

When the perovskite crystalline structure includes a center ion (for example, $PbTiO_3$), a position of a Ti ion may be changed by an external stress or a magnetic field, and thus, polarization may be changed, thereby generating a piezoelectric effect. For example, in the perovskite crystalline structure, a cubic shape corresponding to a symmetric structure may be changed to a tetragonal, orthorhombic, or rhombohedral structure corresponding to an unsymmetric structure, and thus, a piezoelectric effect may be generated. In a tetragonal, orthorhombic, or rhombohedral structure corresponding to an unsymmetric structure, polarization may be high in a morphotropic phase boundary, and realignment of polarization may be easy, whereby the perovskite crystalline structure may have a high piezoelectric characteristic.

FIG. 3B is an enlarged view of a region A of FIG. 3A.

With reference to FIG. 3B, each of the plurality of second portions 220 may be disposed between two adjacent first portions of the plurality of first portions 210. For example, the plurality of second portions 220 may include a material having an expansion coefficient. The expansion coefficient may be a ratio of a horizontal-direction compression deformation rate to a vertical-direction tension deformation rate. In order for the vibration generating device 50 to include a plurality of vibration generating devices having different frequency characteristics in one layer, expansion coefficients of the plurality of second portions 220 may be differently adjusted, or an interval between the first portion 210 and the second portion 220 may be differently adjusted. For example, the second portion 220 may be formed of an auxetic layer. The inventors have recognized that the auxetic layer enables matching of a phase difference or displacement with respect to ceramic which is the first portion 210, or decreases the imbalance of a phase difference. Therefore, durability against bending deformation may be enhanced, and thus, the inventors have recognized that a vibration generating device applied to a flexible display apparatus is provided. For example, the auxetic layer may have a lattice structure, but embodiments are not limited thereto. A displacement variation of the vibration generating device 50 based on an expansion coefficient of the second portion 220 will be described below with reference to FIGS. 4A to 6C.

FIGS. 4A to 6C illustrate a displacement variation of a vibration generating device according to an embodiment of the present disclosure.

With reference to FIGS. 4A to 6C, a second portion 22 may be disposed between adjacent first portions 21. The first portion 21 may include ceramic, and the second portion 22 may include a material having an expansion coefficient. In FIGS. 4A to 6C, a solid line arrow represents expansion, and a dotted line arrow represents contraction.

Figure 4A:
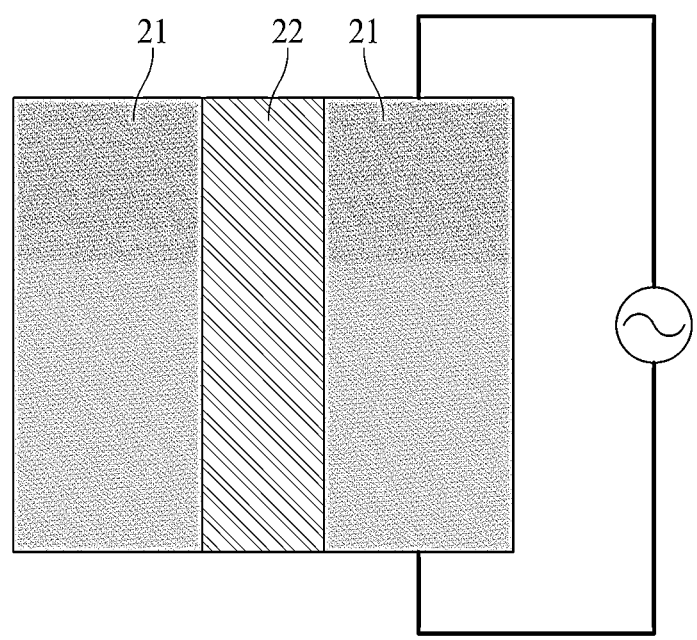
FIGS. 4A to 4C, 5A to 5C, and 6A to 6C illustrate a displacement variation of a vibration generating device according to an embodiment of the present disclosure.
Figure 4B:
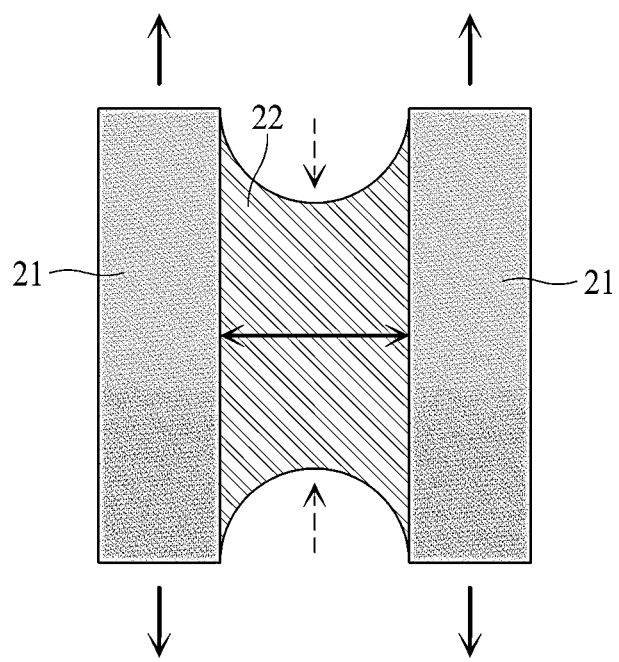
Figure 4C:
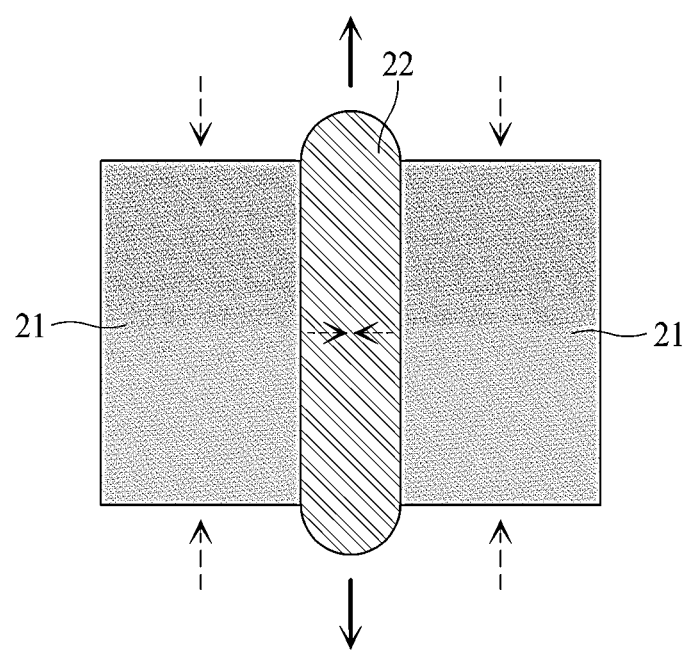

With reference to FIG. 4A, a voltage may be applied to a region between two electrodes of a first portion 21. With reference to FIG. 4B, when an electric field having a poling direction (for example, a direction which is the same as a displacement generating direction) is applied to the first portion 21, the first portion 21 may expand in a horizontal direction. A second portion 22 may have a positive expansion coefficient, and thus, deformation which contracts in the horizontal direction and expands in a vertical direction may occur in the second portion 22 which is less stiffness than the first portion 21. With reference to FIG. 4C, when an electric field having a direction opposite to the poling direction is applied to the first portion 21, the first portion 21 may contract in the horizontal direction. The second portion 22 may have the positive expansion coefficient, and thus, deformation which expands in the horizontal direction and contracts in the vertical direction may occur in the second portion 22 which is less stiffness than the first portion 21. Therefore, when the second portion 22 having the positive expansion coefficient is provided, a displacement of the second portion 22 may have a direction opposite to that of a displacement of the first portion 21. For example, when the second portion 22 having the positive expansion coefficient is provided, an expansion and contraction direction of the second portion 22 may be opposite to an expansion and contraction direction of the first portion 21. Also, a displacement direction of the first portion 21 may be opposite to a displacement direction of the second portion 22, and thus, when a vibration generating device is provided, a waveform of a generated sound or a vibration may be weak and uneven.

Figure 5A:
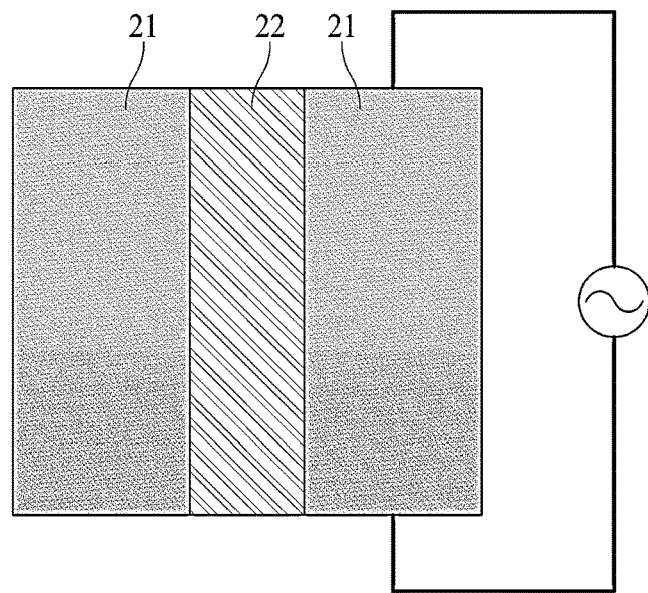
Figure 5B:
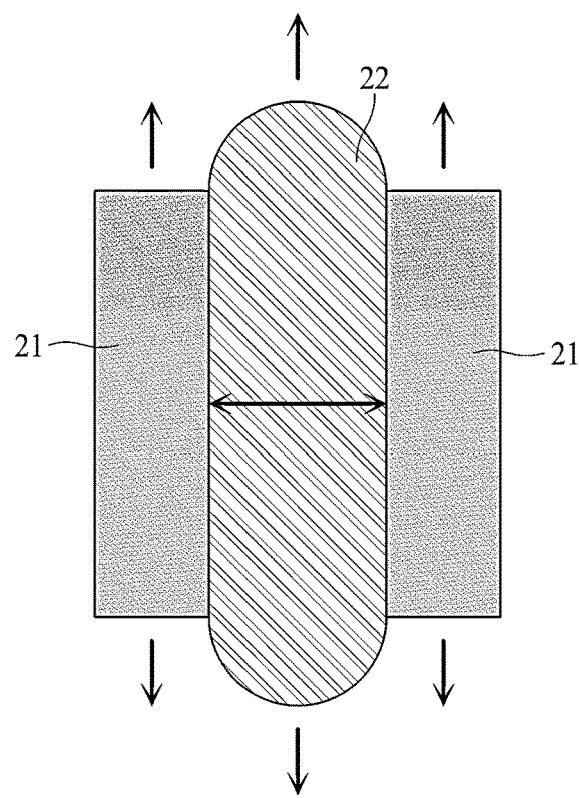
Figure 5C:
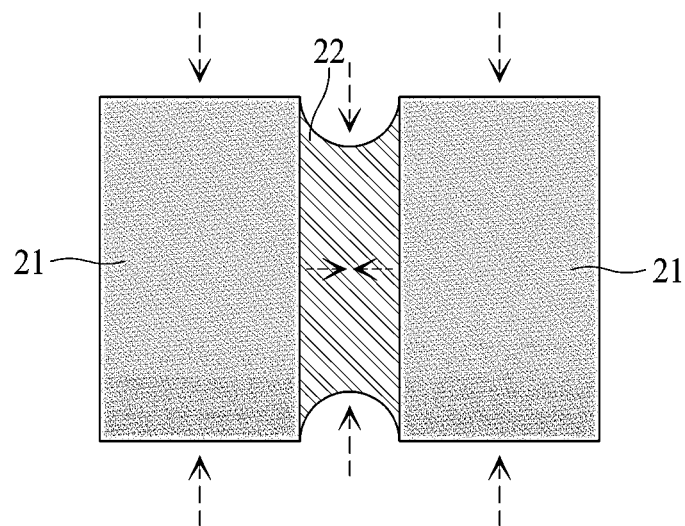

With reference to FIG. 5A, a voltage may be applied to a region between two electrodes of a first portion 21. With reference to FIG. 5B, when an electric field having the same direction as a poling direction is applied to the first portion 21, the first portion 21 may expand in a horizontal direction. A second portion 22 may have a negative expansion coefficient, and thus, deformation which expands in the horizontal direction and expands in a vertical direction may occur in the second portion 22 having stiffness similar to that of the first portion 21. With reference to FIG. 5C, when an electric field having a direction opposite to the poling direction is applied to the first portion 21, the first portion 21 may contract in the horizontal direction. The second portion 22 may have the negative expansion coefficient, and thus, deformation which contracts in the horizontal direction and contracts in the vertical direction may occur in the second portion 22 which is less stiffness than the first portion 21. Therefore, when the second portion 22 having the negative expansion coefficient is provided, a displacement of the second portion 22 may have the same direction as that of a displacement of the first portion 21. For example, when the second portion 22 having the negative expansion coefficient is provided, an expansion and contraction direction of the second portion 22 may be the same as an expansion and contraction direction of the first portion 21. Therefore, the second portion 22 may be provided to have stiffness similar to that of the first portion 21 and thus a displacement direction of the first portion 21 may be the same as a displacement direction of the second portion 22, and accordingly, when a vibration generating device is provided, a waveform of a sound or a vibration may be strong. For example, the second portion 22 having the negative expansion coefficient may be an auxetic layer. For example, the second portion 22 may include polytetrafluoroethylene (PTFE), polypropylene (PP), ultra-high-molecular-weight polyethylene (UHMWPE), or polyurethane (PU), but embodiments are not limited thereto. For example, the second portion 22 may expand in the horizontal direction in a tension process and may contract in the horizontal direction in a compression process, and thus, when the second portion 22 is applied to a display apparatus which is bent or folded, a tensile force corresponding to bending deformation may be strongly applied thereto. Accordingly, a flexible display apparatus having enhanced durability may be implemented. For example, the second portion 22 may include PTFE, PP, UHMWPE, or PU, and the second portion 22 may expand in a vertical direction on the basis of the tensile force, thereby securing durability.

Figure 6A:
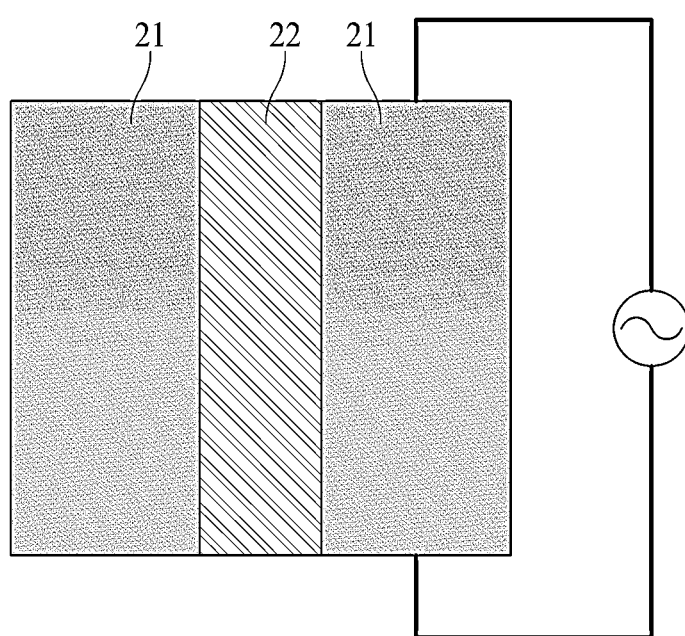
Figure 6B:
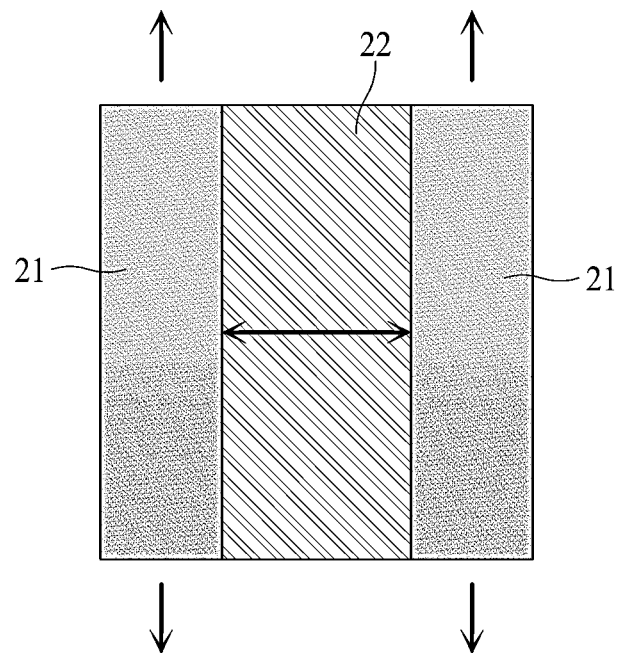
Figure 6C:
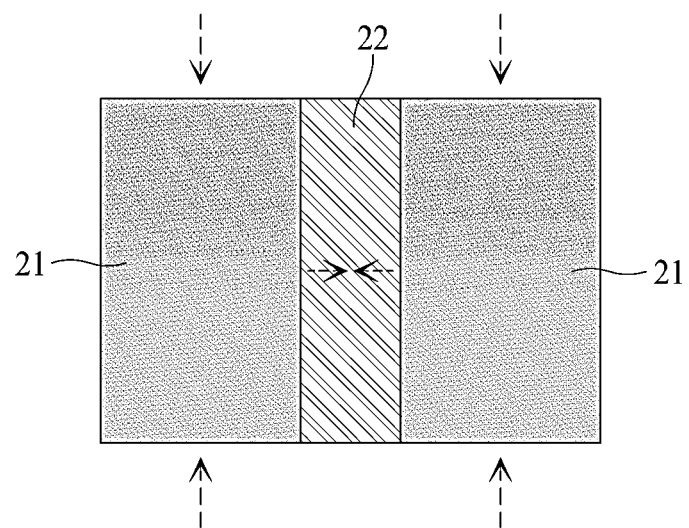

With reference to FIG. 6A, a voltage may be applied to a region between two electrodes of a first portion 21. With reference to FIG. 6B, when an electric field having the same direction as a poling direction is applied to the first portion 21, the first portion 21 may expand in a horizontal direction. A second portion 22 may have a zero expansion coefficient, and thus, deformation which expands in the horizontal direction and expands in a vertical direction may occur in the second portion 22 having stiffness similar to that of the first portion 21. With reference to FIG. 6C, when an electric field having a direction opposite to the poling direction is applied to the first portion 21, the first portion 21 may contract in the horizontal direction. The second portion 22 may have the zero expansion coefficient, and thus, deformation which contracts in the horizontal direction and contracts in the vertical direction may occur in the second portion 22 having stiffness similar to that of the first portion 21. Therefore, when the second portion 22 having the zero expansion coefficient is provided, a displacement of the second portion 22 may have the same direction as that of a displacement of the first portion 21. For example, when the second portion 22 having the zero expansion coefficient is provided, a direction and magnitude of displacement where vertical contraction is hardly performed (for example, displacement hardly occurs) may be almost constant even when the second portion 22 stretches or expands horizontally. For example, when the second portion 22 having the zero expansion coefficient is provided, a magnitude of a displacement of expansion and contraction of the second portion 22 may be almost equal to a magnitude of a displacement of expansion and contraction of the first portion 21. Therefore, the second portion 22 having stiffness similar to that of the first portion 21 may be provided and thus a displacement direction of the first portion 21 may be the same as a displacement direction of the second portion 22, and accordingly, when a vibration generating device is provided, a waveform of a generated sound or a vibration may be strong. The second portion 22 having the zero expansion coefficient may include a cork material, but embodiments are not limited thereto. For example, when the second portion 22 is applied to a display apparatus which is bent or folded, a tensile force corresponding to bending deformation may be strongly applied thereto, and thus, a flexible display apparatus having enhanced durability may be implemented.

Therefore, the second portion 22 of the vibration generating device 50 according to an embodiment of the present disclosure may be implemented to have a negative or zero expansion coefficient, and thus, a strong vibration or sound may be realized. For example, the second portion 22 may have an expansion coefficient of −0.3 to 0, but embodiments are not limited thereto. The second portion 22 having an expansion coefficient smaller than −0.3 may be provided, and thus, an expansion and contraction direction of the second portion 22 may be the same as an expansion and contraction direction of the first portion 21, thereby implementing a vibration generating device having enhanced vibration or sound characteristic. Also, the second portion 220 may be provided to have stiffness similar to that of ceramic which is the first portion 210, and thus, may solve the imbalance of displacement or a phase difference caused by a stiffness difference between the first portion 210 and ceramic, thereby implementing a vibration generating device having enhanced vibration or sound characteristic.

Figure 7:
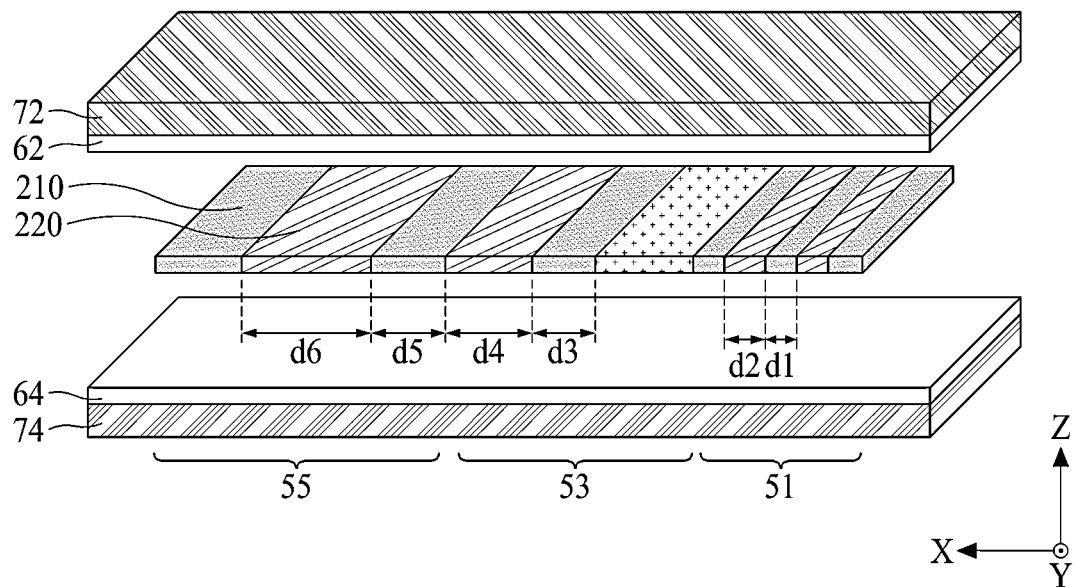
FIG. 7 illustrates a display apparatus according to an embodiment of the present disclosure.
Figure 8:
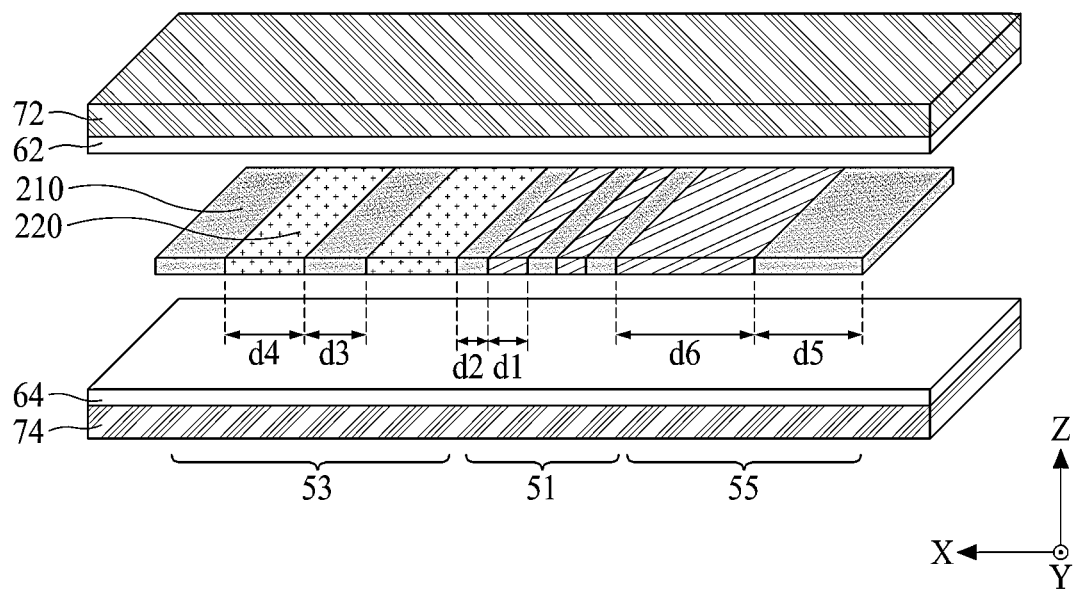
FIG. 8 illustrates a display apparatus according to an embodiment of the present disclosure.

FIG. 7 illustrates a display apparatus according to an embodiment of the present disclosure. FIG. 8 illustrates a display apparatus according to an embodiment of the present disclosure.

FIG. 8 illustrates an embodiment where first to third vibration generating devices 51, 53, and 55 of FIG. 7 are differently arranged, and thus, its description will be given with reference to FIG. 7. The following description may be identically applied to FIG. 8.

With reference to FIG. 7, a display apparatus 100 according to an embodiment of the present disclosure may include a vibration generating device 50. The vibration generating device 50 may include a plurality of first portions 210 and a plurality of second portions 220. For example, the plurality of second portions 220 may be disposed between two adjacent first portions of the plurality of first portions 210. The plurality of first portions 210 may include ceramic having a rod shape. For example, a rod shape of each of the plurality of first portions 210 may be a shape corresponding to a circular cylinder or a polygonal pillar such as a rectangular parallelepiped shape, but embodiments are not limited thereto. For example, the plurality of second portions 220 may have a lattice structure having an auxetic characteristic, but embodiments are not limited thereto. For example, the plurality of first portions 210 and the plurality of second portions 220 may be disposed (or arranged) on the same plane (or the same layer) in parallel. Therefore, by using the plurality of second portions 220, the vibration generating device 50 may enable matching of displacement with respect to the plurality of first portions 210 or may decrease deformation of displacement, and thus, a vibration may increase, thereby a piezoelectric characteristic and flexibility may be secured. Also, the plurality of second portions 220 and the plurality of first portions 210 may be alternately disposed on the same plane in a lengthwise direction X with respect to one side of the vibration generating device 50, and thus, the vibration generating device 50 may be configured with a composite film having a single-layer structure. Also, the composite film may have a thin thickness, and thus, a thickness of the display apparatus 100 may not increase.

The plurality of second portions 220 according to an embodiment of the present disclosure may be disposed to fill a region between corresponding first portions 210 adjacent thereto. The plurality of second portions 220 may be disposed between two adjacent first portions 210, and thus, may absorb an impact applied to the first portions 210, release a stress concentrating on the first portions 210 to enhance the total durability of the vibration generating device 50, and provide flexibility to the vibration generating device 50. The second portions 220 having the negative or zero expansion coefficient may have a force which expands in a vertical direction based on a tensile force generated in the display apparatus, thereby implementing a flexible display apparatus having durability. Accordingly, the vibration generating device 50 may have flexibility, and thus, may be bent in a shape matching that of the display panel 30. For example, the flexible display apparatus may be a bendable display apparatus or a foldable display apparatus, but embodiments are not limited thereto.

A plurality of vibration generating devices 50 may include a first vibration generating device 51, a second vibration generating device 53, and a third vibration generating device 55. The first vibration generating device 51, the second vibration generating device 53, and the third vibration generating device 55 may be implemented to have different frequency characteristics. For example, as described above with reference to FIGS. 4A to 6C, the second portions 220 may be configured to have different expansion coefficients, and thus, the first vibration generating device 51, the second vibration generating device 53, and the third vibration generating device 55 may be implemented to have different frequency characteristics.

For example, the first vibration generating device 51 may have a frequency of a high-pitched sound band, the second vibration generating device 53 may have a frequency of a middle-pitched sound band, and the third vibration generating device 55 may have a frequency of a low-pitched sound band. The second portion 220 included in each of the first to third vibration generating devices 51, 53, and 55 may have the negative or zero expansion coefficient. An expansion coefficient of the second portion 220 in the first vibration generating device 51 may be less than that of the second portion 220 in the second vibration generating device 53, an expansion coefficient of the second portion 220 in the second vibration generating device 53 may be less than that of the second portion 220 in the third vibration generating device 55, and an expansion coefficient of the second portion 220 in the first vibration generating device 51 may be less than that of the second portion 220 in the third vibration generating device 55. As an expansion coefficient increases, a frequency of the high-pitched sound band may be output. For example, a frequency of the high-pitched sound band may be 10 kHz to 20 kHz, a frequency of the middle-pitched sound band may be 200 Hz to 10 kHz, and a frequency of the low-pitched sound band may be 200 Hz or less. However, embodiments of the present disclosure are not limited thereto. For example, the first vibration generating device 51 may be a tweeter or a receiver, the second vibration generating device 53 may be a speaker or a sound generating device, and the third vibration generating device 55 may be a haptic or a haptic device. For example, in the display apparatus 100 of FIG. 1, the first vibration generating device 51, the second vibration generating device 53, and the third vibration generating device 55 may be disposed in a direction from an upper portion of the display apparatus 100 to a lower portion of the display apparatus 100, but embodiments are not limited thereto. For example, as illustrated in FIG. 8, in the display apparatus 100 of FIG. 1, the third vibration generating device 55, the first vibration generating device 51, and the second vibration generating device 53 may be disposed in a direction from the upper portion of the display apparatus 100 to the lower portion of the display apparatus 100.

As another example, a width of the first portion 210 and a width of the second portion 220 may be set to be different from each other so that the first vibration generating device 51, the second vibration generating device 53, and the third vibration generating device 55 have different frequency characteristics. For example, a width d1 of the first portion 210 of the first vibration generating device 51 may be less than a width d3 of the first portion 210 of the second vibration generating device 53, the width d3 of the first portion 210 of the second vibration generating device 53 may be less than a width d5 of the first portion 210 of the third vibration generating device 55, and the width d1 of the first portion 210 of the first vibration generating device 51 may be less than the width d5 of the first portion 210 of the third vibration generating device 55. Accordingly, the first to third vibration generating devices 51, 53, and 55 having different frequencies may be implemented. For example, a width d2 of the second portion 220 of the first vibration generating device 51 may be less than a width d4 of the second portion 220 of the second vibration generating device 53, the width d4 of the second portion 220 of the second vibration generating device 53 may be less than a width d6 of the second portion 220 of the third vibration generating device 55, and the width d2 of the second portion 220 of the first vibration generating device 51 may be less than the width d6 of the second portion 220 of the third vibration generating device 55. Accordingly, the first to third vibration generating devices 51, 53, and 55 having different frequencies may be implemented.

Therefore, the first to third vibration generating devices 51, 53, and 55 having different frequencies may be formed of one layer, and thus, a thickness of the display apparatus 100 may not increase, thereby enhancing a sound characteristic or a vibration characteristic.

Figure 9:
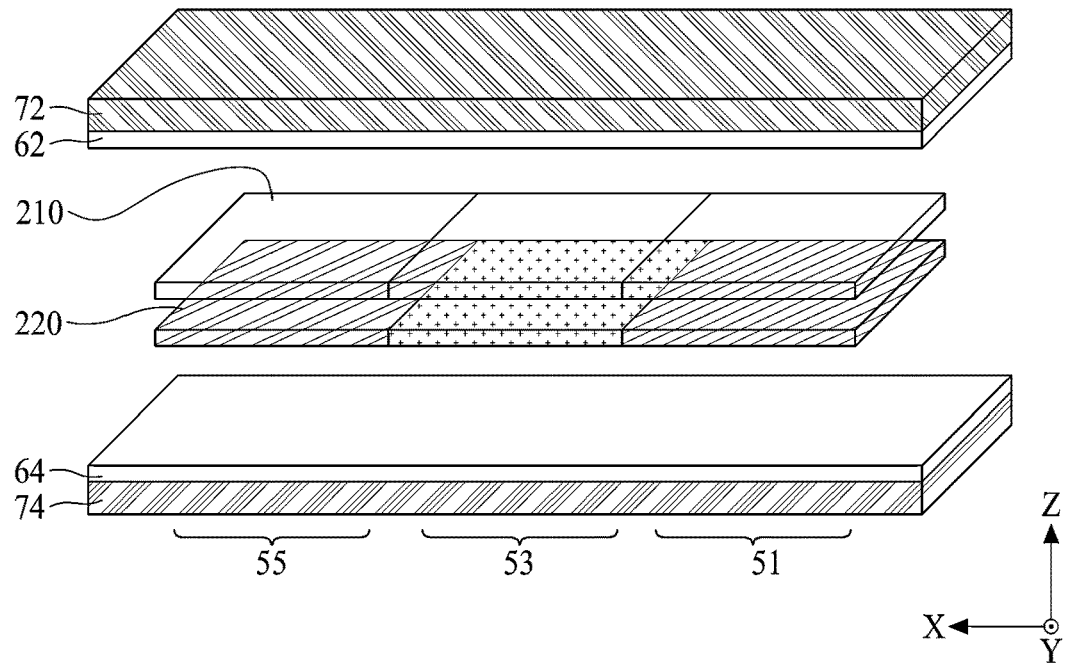
FIG. 9 illustrates a display apparatus according to another embodiment of the present disclosure.
Figure 10:
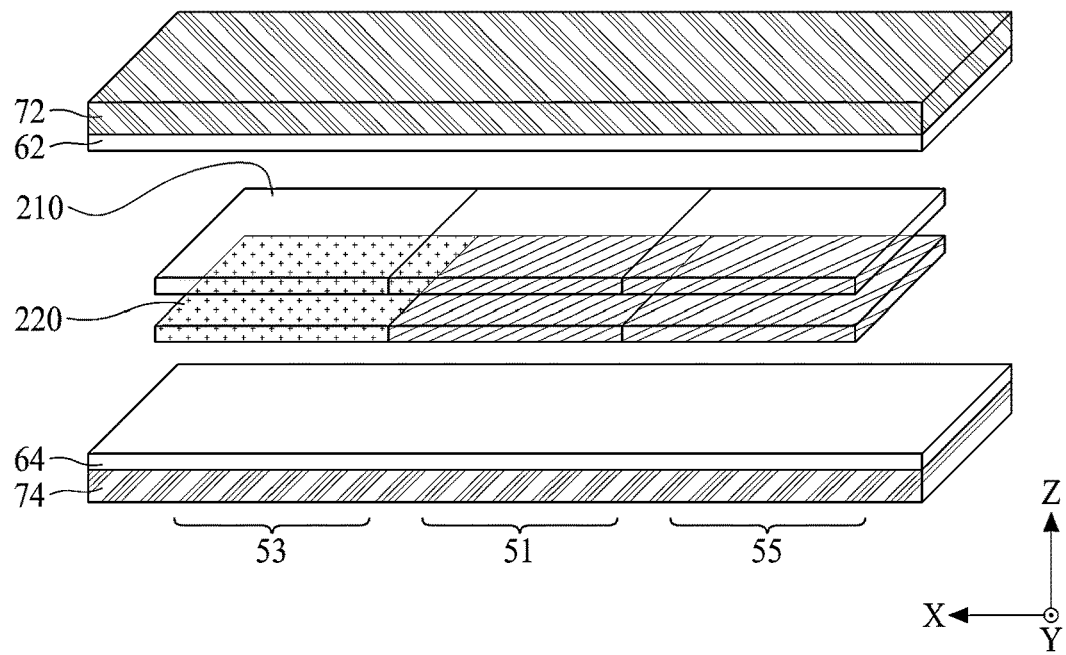
FIG. 10 illustrates a display apparatus according to another embodiment of the present disclosure.

FIG. 9 illustrates a display apparatus according to another embodiment of the present disclosure. FIG. 10 illustrates a display apparatus according to another embodiment of the present disclosure.

FIG. 10 illustrates an embodiment where first to third vibration generating devices 51, 53, and 55 of FIG. 9 are differently arranged, and thus, its description will be given with reference to FIG. 9. The following description may be identically applied to FIG. 10.

With reference to FIG. 9, a display apparatus 100 according to an embodiment of the present disclosure may include a vibration generating device 50. The vibration generating device 50 may include a plurality of first portions 210 and a plurality of second portions 220. For example, the plurality of second portions 220 may be disposed under or on lower surfaces of the plurality of first portions 210. As another example, the plurality of second portions 220 may be disposed under or on lower surfaces of the plurality of first portions 210. The plurality of first portions 210 may include ceramic having a rod shape, and the plurality of second portions 220 may have a lattice structure. For example, the plurality of first portions 210 may be disposed on a whole surface of the display panel 30, and thus, a vibrating surface of the display panel 300 may increase, thereby increasing a vibration characteristic. Also, the vibration generating device 50 may be configured with a composite film having a single-layer structure, and the composite film may have a thin thickness, whereby a thickness of the display apparatus 100 may not increase.

The plurality of second portions 220 according to an embodiment of the present disclosure may be disposed on an upper surface or a lower surface of the first portion 210, and thus, may absorb an impact applied to the first portions 210, release a stress concentrating on the first portions 210 to enhance the total durability of the vibration generating device 50, and provide flexibility to the vibration generating device 50. The vibration generating device 50 may have flexibility, and thus, may be bent in a shape matching that of the display panel 30. The vibration generating device 50 may vibrate based on an electrical signal to vibrate the display panel 30.

A plurality of vibration generating devices 50 may include a first vibration generating device 51, a second vibration generating device 53, and a third vibration generating device 55. The first vibration generating device 51, the second vibration generating device 53, and the third vibration generating device 55 may be implemented to have different frequency characteristics. For example, as described above with reference to FIGS. 4A to 6C, the second portions 220 may be configured to have different expansion coefficients, and thus, the first vibration generating device 51, the second vibration generating device 53, and the third vibration generating device 55 may be implemented to have different frequency characteristics.

For example, the first vibration generating device 51 may have a frequency of a high-pitched sound band, the second vibration generating device 53 may have a frequency of a middle-pitched sound band, and the third vibration generating device 55 may have a frequency of a low-pitched sound band. In this case, an expansion coefficient of the second portion 220 in the first vibration generating device 51 may be less than that of the second portion 220 in the second vibration generating device 53, an expansion coefficient of the second portion 220 in the second vibration generating device 53 may be less than that of the second portion 220 in the third vibration generating device 55, and an expansion coefficient of the second portion 220 in the first vibration generating device 51 may be less than that of the second portion 220 in the third vibration generating device 55. As an expansion coefficient increases, a frequency of the high-pitched sound band may be output. For example, a frequency of the high-pitched sound band may be 10 kHz to 20 kHz, a frequency of the middle-pitched sound band may be 200 Hz to 10 kHz, and a frequency of the low-pitched sound band may be 200 Hz or less. However, embodiments of the present disclosure are not limited thereto. For example, the first vibration generating device 51 may be a tweeter or a receiver, the second vibration generating device 53 may be a speaker or a sound generating device, and the third vibration generating device 55 may be a haptic or a haptic device. For example, in the display apparatus 100 of FIG. 1, the first vibration generating device 51, the second vibration generating device 53, and the third vibration generating device 55 may be disposed in a direction from an upper portion of the display apparatus 100 to a lower portion of the display apparatus 100, but embodiments are not limited thereto. For example, as illustrated in FIG. 8, in the display apparatus 100 of FIG. 1, the third vibration generating device 53, the first vibration generating device 51, and the second vibration generating device 52 may be disposed in a direction from the upper portion of the display apparatus 100 to the lower portion of the display apparatus 100.

Therefore, the vibration generating device 50 according to an embodiment of the present disclosure may be implemented as one film, and thus, may be slimmed, thereby reducing or preventing an increase in a driving voltage. A vibration generating device which is one film having different frequency characteristics may be implemented, and thus, a thickness of a display apparatus may not increase, thereby providing a display apparatus having a vibration characteristic and flexibility.

FIGS. 11A to 12B illustrate a display apparatus according to another embodiment of the present disclosure.

With reference to FIGS. 11A to 12B, a display apparatus according to another embodiment of the present disclosure may further include a partition near a display panel 30. The partition may be an air gap or a space where a sound is generated when the display panel 30 is vibrated by a vibration generating device 50. An air gap or a space which generates or transfers a sound may be referred to as a partition. A partition may be referred to as an enclosure or a baffle, but the term is not limited thereto.

For example, a partition 600 may include a first partition 610. The first partition 610 may be disposed between the display panel 30 and a supporting member 70.

The first partition 610 may be disposed to surround the vibration generating device 50. For example, the first partition 610 may be disposed along a region between a rear periphery of the display panel 30 and a front periphery of the supporting member 70. For example, the first partition 610 may be disposed to surround entire vibration generating device 50. For example, the first partition 610 may be disposed along the region between the rear periphery of the display panel 30 and the front periphery of the supporting member 70. The first partition 610 may be referred to as an edge partition, a periphery partition, a sound blocking member, an edge enclosure, a periphery enclosure, or a baffle, but the terms are not limited thereto. For example, the first partition 610 may be disposed to contact or to be adjacent to the connection member 20 illustrated in FIG. 2. As another example, the first partition 610 may be implemented as one body with the connection member 20.

Figure 11A:
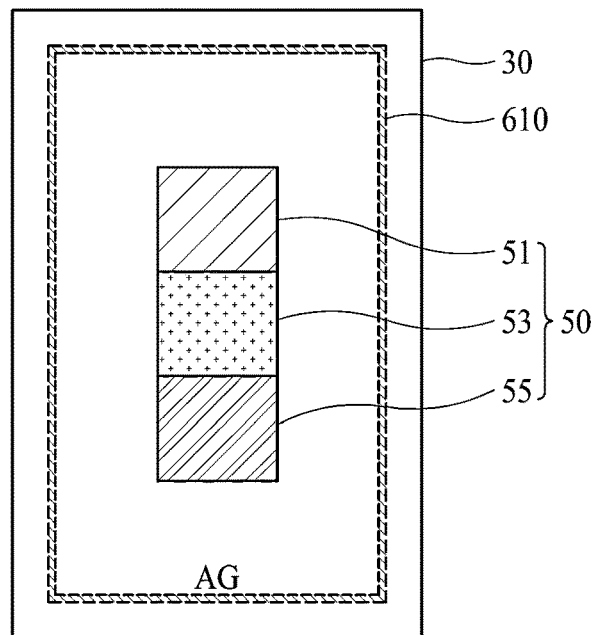
FIGS. 11A to 12B illustrate a display apparatus according to another embodiment of the present disclosure.
Figure 11B:
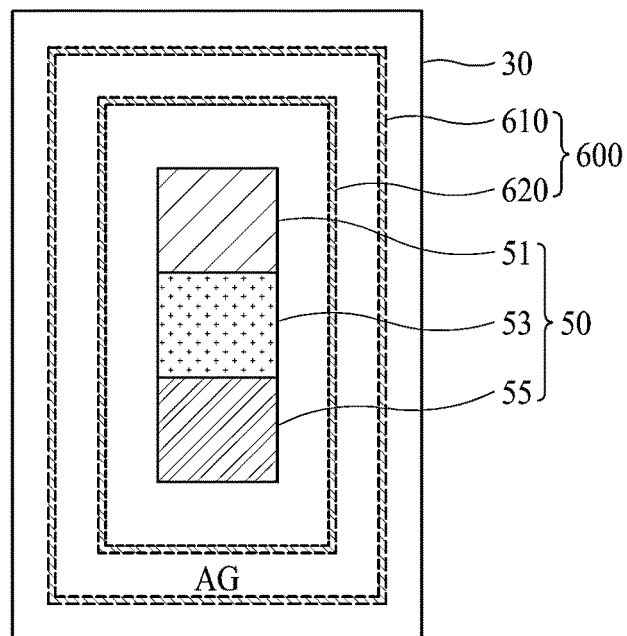

With reference to FIGS. 11A and 11B, the display apparatus according to another embodiment of the present disclosure may include the vibration generating device 50 illustrated in FIGS. 7 and 9. For example, a first vibration generating device 51 may be disposed at an upper portion of the display panel 30, a second vibration generating device 53 may be disposed at a center of the display panel 30, and a third vibration generating device 55 may be disposed at a lower portion of the display panel 30. For example, the first vibration generating device 51 may be a receiver and/or a tweeter, the second vibration generating device 53 may be a speaker or a sound generating device, and the third vibration generating device 55 may be a haptic or a haptic device. For example, the first vibration generating device 51 may output a frequency of 10 kHz to 20 kHz, the second vibration generating device 53 may output a frequency of 200 Hz to 10 kHz, and the third vibration generating device 55 may output a frequency of 200 Hz or less.

Figure 12A:
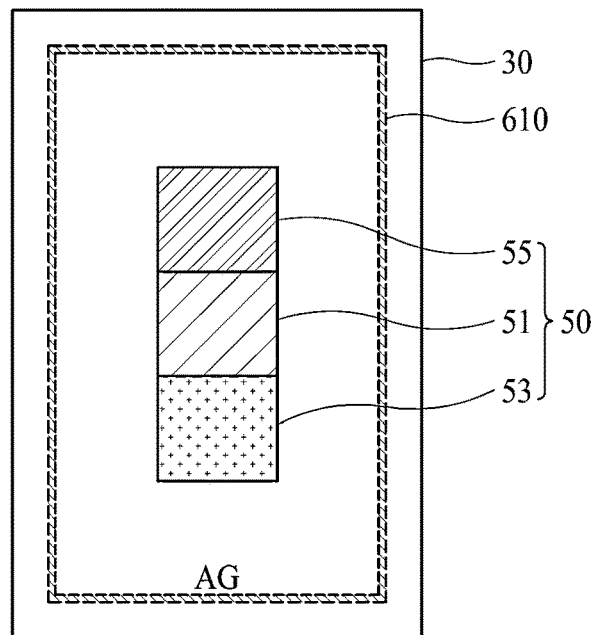
Figure 12B:
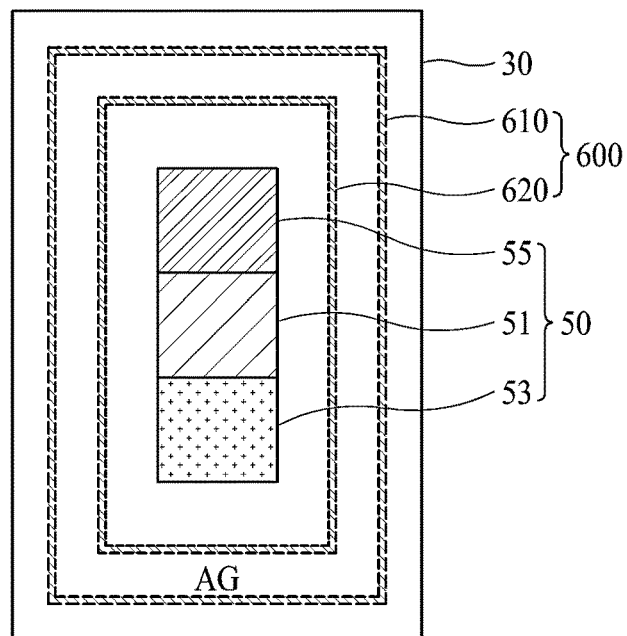

With reference to FIGS. 11B and 12B, the partition 600 may include a second partition 620. The second partition 620 may surround the vibration generating device 50. The second partition 620 according to an embodiment of the present disclosure may have a shape which surrounds the vibration generating device 50, but embodiments are not limited thereto. For example, the second partition 620 may have a shape which is the same as or different from a whole shape of the vibration generating device 50. For example, when the vibration generating device 50 has a rectangular shape, the second partition 620 may have a rectangular shape having a size which is relatively greater than that of the vibration generating device 50. As another example, the second partition 620 may have a circular shape which surrounds the vibration generating device 50.

The second partition 620 may limit (or define) a vibration region (or a vibration area) of the display panel 30 performed by the vibration generating device 50. For example, in the display panel 30, as a size of the second partition 620 increases, a vibration region of the display panel 30 may increase, and thus, a characteristic of a low-pitched sound band may be enhanced. On the other hand, in the display panel 30, as a size of the second partition 620 decreases, a vibration region of the display panel 30 may decrease, and thus, a characteristic of a high-pitched sound band may be enhanced. Therefore, a size of the second partition 620 may be set based on a characteristic of a sound band based on a vibration of the display panel 30.

For example, the partition 600 may include polyurethane, polyolefin, and/or the like, but embodiments are not limited thereto. As another example, the partition 600 may include a single-sided tape, a double-sided tape, a single-sided foam pad, a double-sided foam pad, a single-sided foam tape, and/or a double-sided foam tape, and for example, may include a material having an elastic force which enables compression to be made to a certain degree.

The first partition 610 may provide an air gap AG between the display panel 30 and the supporting member 70 along with the second partition 620. For example, the air gap AG may be referred to as a vibration space, a sound pressure space, a sound box, a sound part, a resonance box, or a resonance part, but the term is not limited thereto.

The air gap AG may be provided in a region of the display panel 30 surrounded by the second partition 620 disposed in the display panel 30 and the first partition 610 disposed in the display panel 30.

Therefore, the display apparatus according to an embodiment of the present disclosure may include the partition 600, and thus, may optimize a reproduction sound band. For example, the display apparatus according to an embodiment of the present disclosure may include at least one of the first and second partitions 610 and 620.

With reference to FIGS. 12A and 12B, the display apparatus according to another embodiment of the present disclosure may include the vibration generating device 50 illustrated in FIGS. 7 and 9. For example, a third vibration generating device 55 may be disposed at an upper portion of the display panel 30, a first vibration generating device 51 may be disposed at a center of the display panel 30, and a second vibration generating device 53 may be disposed at a lower portion of the display panel 30. For example, the third vibration generating device 55 may be a haptic or a haptic device, the first vibration generating device 51 may be a receiver and/or a tweeter, and the second vibration generating device 53 may be a speaker or a sound generating device. For example, the third vibration generating device 55 may output a frequency of 200 Hz or less, the first vibration generating device 51 may output a frequency of 10 kHz to 20 kHz, and the second vibration generating device 53 may output a frequency of 200 Hz to 10 KHz.

Figure 13A:
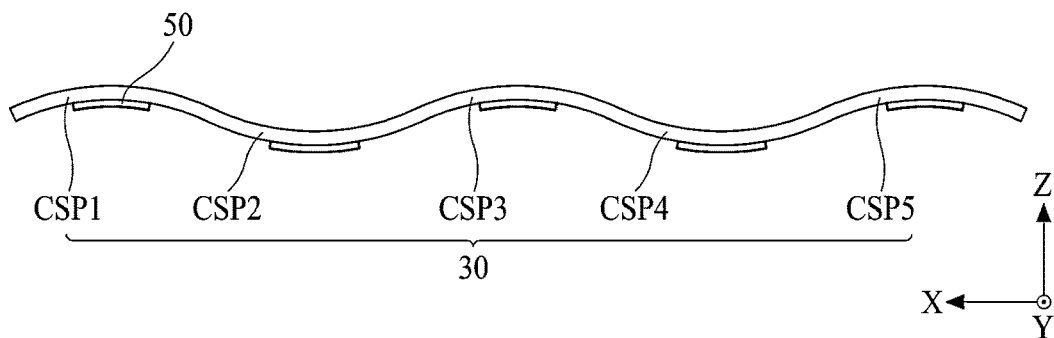
FIGS. 13A to 13C illustrate a display apparatus according to another embodiment of the present disclosure.
Figure 13B:
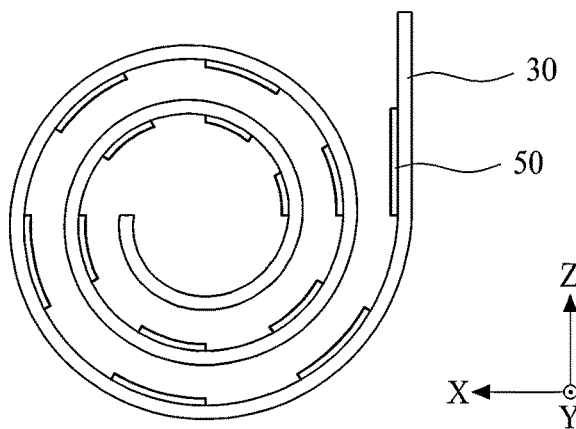
Figure 13C:
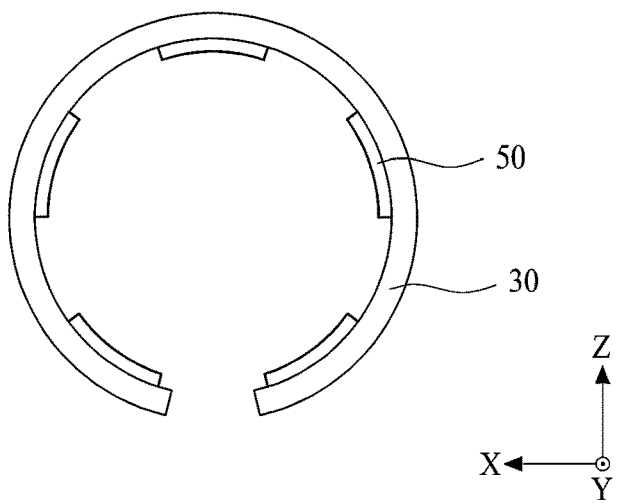

FIGS. 13A to 13C illustrate a display apparatus according to another embodiment of the present disclosure.

With reference to FIGS. 13A to 13C, the display apparatus according to another embodiment of the present disclosure may include a vibration generating device according to another embodiment of the present disclosure and may be configured with one of the vibration generating devices of FIGS. 7 to 10.

With reference to FIG. 13A, a vibration generating device 50 according to embodiments of the present disclosure may be applied to a commercial display apparatus or a flexible display apparatus including a display panel 30 including a plurality of curved surface portions CSP1 to CSP5 which are concave or convex. For example, the vibration generating device 50 may be implemented to be bent in a shape having a curvature value (or a curvature radius) matching a convex portion or a concave portion of each of the curved surface portions CSP1 to CSP5 of the display panel 30 and may be disposed in the convex portion or the concave portion of each of the curved surface portions CSP1 to CSP5 of the display panel 30. As another example, the vibration generating device 50 may be implemented to have a shape corresponding to the curvature value (or the curvature radius) of each of the curved surface portions CSP1 to CSP5 of the display panel 30 and may be disposed on a whole rear surface of the display panel 30.

With reference to FIG. 13B, a vibration generating device 50 according to embodiments of the present disclosure may be applied to a rollable display apparatus including a display panel 30 which is wound in a spiral shape or unwound. For example, the vibration generating device 50 according to embodiments of the present disclosure may be implemented to have a shape having a curvature value (or a curvature radius) of the display panel 30 which is wound in a spiral shape or unwound, and a plurality of vibration generating devices 50 may be arranged at certain intervals on a rear surface of the display panel 30. As another example, the vibration generating device 50 may be implemented to have a shape corresponding to the curvature value (or the curvature radius) of the display panel 30 and may be disposed on the whole rear surface of the display panel 30.

With reference to FIG. 13C, a vibration generating device 50 according to embodiments of the present disclosure may be applied to a wearable display apparatus including a display panel 30 which is wound around a wrist of a user and is bent in a C-shape. For example, the vibration generating device 50 according to embodiments of the present disclosure may be implemented to have a shape having a curvature value (or a curvature radius) of the display panel 30 which is bent in the C-shape, and a plurality of vibration generating devices 50 may be arranged at certain intervals on a rear surface of the display panel 30. As another example, the vibration generating device 50 may be implemented to have a shape corresponding to the curvature value (or the curvature radius) of the display panel 30 which is bent in the C-shape and may be disposed on the whole rear surface of the display panel 30.

The vibration generating device according to an embodiment of the present disclosure may be applied as a vibration generating device provided in a display apparatus. The display apparatus according to an embodiment of the present disclosure may be applied to mobile devices, video phones, smart watches, watch phones, wearable devices, foldable devices, rollable devices, bendable devices, flexible devices, curved devices, portable multimedia players (PMPs), personal digital assistants (PDAs), electronic organizers, desktop personal computers (PCs), laptop PCs, netbook computers, workstations, navigation devices, automotive navigation devices, automotive display apparatuses, TVs, wall paper display apparatuses, signage devices, game machines, notebook computers, monitors, cameras, camcorders, home appliances, etc. Also, the vibration generating device according to an embodiment of the present disclosure may be applied to organic light emitting lighting devices or inorganic light emitting lighting devices. When the vibration generating device is applied to a lighting device, the vibration generating device may act as lighting and a speaker.

A display apparatus according to an embodiment of the present disclosure will be described below.

A display apparatus according to an embodiment of the present disclosure includes a display panel configured to display an image and a plurality of vibration generating devices configured to vibrate the display panel, wherein each of the plurality of vibration generating devices includes a plurality of first portions having a piezoelectric characteristic and a plurality of second portions disposed near the plurality of first portions to have an expansion coefficient, and the plurality of vibration generating devices have different expansion coefficients.

According to some embodiments of the present disclosure, the plurality of second portions may be disposed between the plurality of first portions.

According to some embodiments of the present disclosure, the plurality of first portions may be disposed on the same plane as the plurality of second portions.

According to some embodiments of the present disclosure, the plurality of second portions may be disposed on upper surfaces or lower surfaces of the plurality of first portions.

According to some embodiments of the present disclosure, the plurality of vibration generating devices may include a first vibration generating device, a second vibration generating device, and a third vibration generating device, and an expansion coefficient of the first vibration generating device may be less than an expansion coefficient of the second vibration generating device, and an expansion coefficient of the second vibration generating device may be less than an expansion coefficient of the third vibration generating device.

According to some embodiments of the present disclosure, the first vibration generating device may be implemented as one or more of a receiver and a tweeter, the second vibration generating device is implemented as a speaker, and the third vibration generating device may be implemented as a haptic device.

According to some embodiments of the present disclosure, the plurality of vibration generating devices may include a first vibration generating device, a second vibration generating device, and a third vibration generating device, and a width of each of the plurality of second portions of the first vibration generating device may be less than a width of each of the plurality of second portions of the second vibration generating device, and a width of each of the plurality of second portions of the second vibration generating device may be less than a width of each of the plurality of second portions of the third vibration generating device.

According to some embodiments of the present disclosure, the plurality of vibration generating devices may include a first vibration generating device, a second vibration generating device, and a third vibration generating device, and a width of each of the plurality of first portions of the first vibration generating device may be less than a width of each of the plurality of first portions of the second vibration generating device, and a width of each of the plurality of first portions of the second vibration generating device may be less than a width of each of the plurality of first portions of the third vibration generating device.

According to some embodiments of the present disclosure, an expansion and contraction direction of each of the plurality of first portions may be the same as an expansion and contraction direction of each of the plurality of second portions.

According to some embodiments of the present disclosure, the display apparatus may further include an adhesive member between a rear surface of the display panel and the plurality of vibration generating devices, a first electrode on an upper surface of the plurality of vibration generating devices under the adhesive member, and a second electrode on a lower surface of the plurality of vibration generating devices.

According to some embodiments of the present disclosure, the display apparatus may further include a first protection layer on an upper surface of the first electrode under the adhesive member, and a second protection layer on a lower surface of the plurality of vibration generating devices.

According to some embodiments of the present disclosure, each of the plurality of second portions may be formed of an auxetic layer or a cork material According to some embodiments of the present disclosure, the expansion coefficient of each of the plurality of second portions may be within a range from −0.3 to 0.

According to some embodiments of the present disclosure, the plurality of second portions may have flexibility.

A display apparatus according to an embodiment of the present disclosure includes a display panel configure to display an image and a plurality of vibration generating devices configured to vibrate the display panel, wherein each of the plurality of vibration generating devices includes a plurality of piezoelectric portions having a piezoelectric characteristic and a plurality of expansion portions disposed near the plurality of piezoelectric portions, and the plurality of vibration generating devices are implemented to have different frequency characteristics.

According to some embodiments of the present disclosure, the plurality of piezoelectric portions may be disposed on the same plane as the plurality of expansion portions.

According to some embodiments of the present disclosure, the plurality of piezoelectric portions may be disposed on upper surfaces or lower surfaces of the plurality of expansion portions.

According to some embodiments of the present disclosure, the plurality of vibration generating devices may include a first vibration generating device having a frequency of a high-pitched sound band, a second vibration generating device having a frequency of a middle-pitched sound band, and a third vibration generating device having a frequency of a low-pitched sound band.

According to some embodiments of the present disclosure, a frequency of the high-pitched sound band is 10 kHz to 20 kHz, a frequency of the middle-pitched sound band is 200 Hz to 10 kHz, and a frequency of the low-pitched sound band is 200 Hz or less.

According to some embodiments of the present disclosure, the first vibration generating device may be implemented as one or more of a receiver and a tweeter, the second vibration generating device may be implemented as a speaker, and the third vibration generating device may be implemented as a haptic device.

According to some embodiments of the present disclosure, an expansion coefficient of each of the plurality of expansion portions of the first vibration generating device may be less than an expansion coefficient of each of the plurality of expansion portions of the second vibration generating device, and the expansion coefficient of each of the plurality of expansion portions of the second vibration generating device may be less than an expansion coefficient of each of the plurality of expansion portions of the third vibration generating device.

According to some embodiments of the present disclosure, a width of each of the plurality of expansion portions of the first vibration generating device may be less than a width of each of the plurality of expansion portions of the second vibration generating device, and a width of each of the plurality of expansion portions of the second vibration generating device may be less than a width of each of the plurality of expansion portions of the third vibration generating device.

According to some embodiments of the present disclosure, a width of each of the plurality of piezoelectric portions of the first vibration generating device may be less than a width of each of the plurality of piezoelectric portions of the second vibration generating device, and a width of each of the plurality of piezoelectric portions of the second vibration generating device may be less than a width of each of the plurality of piezoelectric portions of the third vibration generating device.

According to some embodiments of the present disclosure, the first vibration generating device may be disposed at an upper portion of the display panel, a second vibration generating device may be disposed at a center of the display panel, and a third vibration generating device may be disposed at a lower portion of the display panel.

According to some embodiments of the present disclosure, the third vibration generating device may be disposed at an upper portion of the display panel, the first vibration generating device may be disposed at a center of the display panel, and the second vibration generating device may be disposed at the lower portion of the display panel.

According to some embodiments of the present disclosure, the display apparatus may further include a supporting member on a rear surface of the display panel; and a partition between the display panel and the supporting member.

According to some embodiments of the present disclosure, the display apparatus may further include a partition surrounding the plurality of vibration generating devices.

According to some embodiments of the present disclosure, the display apparatus may further include a supporting member on a rear surface of the display panel, a first partition between the display panel and the supporting member, and a second partition surrounding the plurality of vibration generating devices.

According to embodiments of the present disclosure, the first partition may be disposed along a region between a rear periphery of the display panel and a front periphery of the supporting member.

According to embodiments of the present disclosure, a size of the expansion partition may be configured to adjust based on a characteristic of a sound band to be reproduced by the vibration of the display panel.

According to embodiments of the present disclosure, the plurality of expansion portions may have flexibility.

According to embodiments of the present disclosure, each of the plurality of expansion portions may have a negative or zero expansion coefficient.

According to embodiments of the present disclosure, each of the plurality of expansion portions may be formed of an auxetic layer or a cork material.

According to embodiments of the present disclosure, the expansion coefficient of each of the plurality of expansion portions may be within a range from −0.3 to 0.

The display apparatus according to embodiments of the present disclosure may include a vibration generating device which vibrates a display panel, and thus, may be implemented with a sound generating device which generates a sound so that a traveling direction of a sound of the display apparatus is a direction toward a front surface of the display panel, a haptic device which outputs a feedback based on an action of a user, and a receiver or tweeter.

According to embodiments of the present disclosure, a display apparatus implemented with one vibration generating device for implementing a speaker, a haptic device, and a receiver or a tweeter may be provided.

It will be apparent to those skilled in the art that various modifications and variations may be made in the display apparatus of the present disclosure without departing from the technical idea or scope of the disclosure. Thus, it may be intended that embodiments of the present disclosure cover the modifications and variations of this disclosure provided they come within the scope of the appended claims and their equivalents.

What is claimed is:

1. A display apparatus, comprising:
a display panel configured to display an image; and
a film actuator configured to vibrate the display panel, the film actuator comprising a plurality of vibration generating devices configured with a composite film;
a first electrode at an upper surface of the composite film; and
a second electrode at a lower surface of the composite film,
wherein the plurality of vibration generating devices are configured to have different expansion coefficients from each other.

2. The display apparatus of claim 1, wherein the composite film comprises:
a plurality of expansion portions configured to have flexibility, and
a plurality of vibration portions between the plurality of expansion portions and configured to have a piezoelectric characteristic.

3. The display apparatus of claim 2, wherein each of the plurality of expansion portions has a negative or zero expansion coefficient.

4. The display apparatus of claim 3, wherein the expansion coefficient of each of the plurality of expansion portions is within a range from −0.3 to 0.

5. The display apparatus of claim 2, wherein the plurality of vibration portions are disposed on the same plane as the plurality of expansion portions.

6. The display apparatus of claim 2, wherein each of the plurality of expansion portions is formed of an auxetic layer or a cork material.

7. The display apparatus of claim 2, wherein an expansion and contraction direction of each of the plurality of vibration portions is the same as an expansion and contraction direction of a corresponding one of the plurality of expansion portions.

8. The display apparatus of claim 2, wherein each of the plurality of vibration generating devices is configured to include the plurality of vibration portions and the plurality of expansion portions.

9. The display apparatus of claim 8, wherein:
the film actuator comprises a first vibration generating device, a second vibration generating device, and a third vibration generating device, and
the second vibration generating device is between the first vibration generating device and the third vibration generating device.

10. The display apparatus of claim 9, wherein:
a width of each of the plurality of vibration portions of the first vibration generating device is less than a width of each of the plurality of vibration portions of the second vibration generating device, and
a width of each of the plurality of vibration portions of the second vibration generating device is less than a width of each of the plurality of vibration portions of the third vibration generating device.

11. The display apparatus of claim 9, wherein:
a width of each of the plurality of expansion portions of the first vibration generating device is less than a width of each of the plurality of expansion portions of the second vibration generating device, and
a width of each of the plurality of expansion portions of the second vibration generating device is less than a width of each of the plurality of expansion portions of the third vibration generating device.

12. The display apparatus of claim 8, wherein:
the film actuator comprises a first vibration generating device, a second vibration generating device, and a third vibration generating device, and
the first vibration generating device is between the second vibration generating device and the third vibration generating device.

13. The display apparatus of claim 12, wherein:
a width of each of the plurality of vibration portions of the first vibration generating device is less than a width of each of the plurality of vibration portions of the second vibration generating device, and
a width of each of the plurality of vibration portions of the second vibration generating device is less than a width of each of the plurality of vibration portions of the third vibration generating device.

14. The display apparatus of claim 12, wherein:
a width of each of the plurality of expansion portions of the first vibration generating device is less than a width of each of the plurality of expansion portions of the second vibration generating device, and
a width of each of the plurality of expansion portions of the second vibration generating device is less than a width of each of the plurality of expansion portions of the third vibration generating device.

15. The display apparatus of claim 1, wherein the composite film is configured to have a single-layer structure.

16. The display apparatus of claim 1, wherein the film actuator comprises:
a first protection layer at an upper surface of the first electrode; and
a second protection layer at a lower surface of the second electrode.

17. The display apparatus of claim 1, further comprising an adhesive member between a rear surface of the display panel and the film actuator.

18. The display apparatus of claim 17, wherein the adhesive member is between the rear surface of the display panel and the first electrode.

19. The display apparatus of claim 1, wherein the film actuator comprises:
a first vibration generating device having a frequency of a high-pitched sound band, a second vibration generating device having a frequency of a middle-pitched sound band, and
a third vibration generating device having a frequency of a low-pitched sound band.

20. The display apparatus of claim 19, wherein:
the second vibration generating device is between the first vibration generating device and the third vibration generating device, or
the first vibration generating device is between the second vibration generating device and the third vibration generating device.

21. The display apparatus of claim 19, wherein:
a frequency of the high-pitched sound band is in a range from 10 kHz to 20 kHz,
a frequency of the middle-pitched sound band is in a range from 200 Hz to 10 kHz, and
a frequency of the low-pitched sound band is in a range from 200 Hz or less.

22. The display apparatus of claim 1, wherein the film actuator comprises:
a first vibration generating device implemented as one or more of a receiver and a tweeter,
a second vibration generating device implemented as a speaker, and
a third vibration generating device implemented as a haptic device.

23. The display apparatus of claim 22, wherein:
the second vibration generating device is between the first vibration generating device and the third vibration generating device, or
the first vibration generating device is between the second vibration generating device and the third vibration generating device.

24. A display apparatus, comprising:
a display panel configured to display an image; and
a film actuator configured to vibrate the display panel, the film actuator comprising a plurality of vibration generating devices at a composite film and configured to have different sizes;
a first electrode at an upper surface of the composite film; and
a second electrode at a lower surface of the composite film,
wherein the plurality of vibration generating devices are configured to have different frequency characteristics from each other.

25. The display apparatus of claim 24, wherein the composite film comprises:
a plurality of expansion portions configured to have flexibility, and
a plurality of vibration portions between the plurality of expansion portions and configured to have a piezoelectric characteristic.

26. The display apparatus of claim 25, wherein each of the plurality of vibration generating devices is configured to include two or more of the plurality of vibration portions and two or more of the plurality of expansion portions.

27. The display apparatus of claim 26, wherein the two or more vibration portions configured in each of the plurality of vibration generating devices have different sizes from each other.

28. The display apparatus of claim 25, wherein each of the plurality of expansion portions is formed of an auxetic layer or a cork material.

29. The display apparatus of claim 25, wherein an expansion and contraction direction of each of the plurality of vibration portions is the same as an expansion and contraction direction of a corresponding one of the plurality of expansion portions.

30. The display apparatus of claim 25, wherein each of the plurality of vibration generating devices is configured to include the plurality of vibration portions and the plurality of expansion portions.

31. The display apparatus of claim 30, wherein:
the film actuator comprises a first vibration generating device, a second vibration generating device, and a third vibration generating device, and
the second vibration generating device is between the first vibration generating device and the third vibration generating device.

32. The display apparatus of claim 31, wherein:
a width of each of the plurality of vibration portions of the first vibration generating device is less than a width of each of the plurality of vibration portions of the second vibration generating device, and
a width of each of the plurality of vibration portions of the second vibration generating device is less than a width of each of the plurality of vibration portions of the third vibration generating device.

33. The display apparatus of claim 31, wherein:
a width of each of the plurality of expansion portions of the first vibration generating device is less than a width of each of the plurality of expansion portions of the second vibration generating device, and
a width of each of the plurality of expansion portions of the second vibration generating device is less than a width of each of the plurality of expansion portions of the third vibration generating device.

34. The display apparatus of claim 30, wherein:
the film actuator comprises a first vibration generating device, a second vibration generating device, and a third vibration generating device, and
the first vibration generating device is between the second vibration generating device and the third vibration generating device.

35. The display apparatus of claim 34, wherein:
a width of each of the plurality of vibration portions of the first vibration generating device is less than a width of each of the plurality of vibration portions of the second vibration generating device, and
a width of each of the plurality of vibration portions of the second vibration generating device is less than a width of each of the plurality of vibration portions of the third vibration generating device.

36. The display apparatus of claim 34, wherein:
a width of each of the plurality of expansion portions of the first vibration generating device is less than a width of each of the plurality of expansion portions of the second vibration generating device, and
a width of each of the plurality of expansion portions of the second vibration generating device is less than a width of each of the plurality of expansion portions of the third vibration generating device.

37. The display apparatus of claim 24, wherein the composite film is configured to have a single-layer structure.

38. The display apparatus of claim 24, wherein the film actuator comprises:
a first protection layer at an upper surface of the first electrode; and
a second protection layer at a lower surface of the second electrode.

39. The display apparatus of claim 24, further comprising an adhesive member between a rear surface of the display panel and the film actuator.

40. The display apparatus of claim 39, wherein the adhesive member is between the rear surface of the display panel and the first electrode.

41. The display apparatus of claim 24, wherein the film actuator comprises:
- a first vibration generating device having a frequency of a high-pitched sound band,
- a second vibration generating device having a frequency of a middle-pitched sound band, and
- a third vibration generating device having a frequency of a low-pitched sound band.

42. The display apparatus of claim 41, wherein:
- the second vibration generating device is between the first vibration generating device and the third vibration generating device, or
- the first vibration generating device is between the second vibration generating device and the third vibration generating device.

43. The display apparatus of claim 41, wherein:
- a frequency of the high-pitched sound band is in a range from 10 kHz to 20 kHz,
- a frequency of the middle-pitched sound band is in a range from 200 Hz to 10 kHz, and
- a frequency of the low-pitched sound band is in a range from 200 Hz or less.

44. The display apparatus of claim 24, wherein the film actuator comprises:
- a first vibration generating device implemented as one or more of a receiver and a tweeter,
- a second vibration generating device implemented as a speaker, and
- a third vibration generating device implemented as a haptic device.

45. The display apparatus of claim 44, wherein:
- the second vibration generating device is between the first vibration generating device and the third vibration generating device, or
- the first vibration generating device is between the second vibration generating device and the third vibration generating device.

* * * * *